United States Patent
Roebke et al.

(10) Patent No.: US 9,986,320 B2
(45) Date of Patent: May 29, 2018

(54) PORTABLE GUITAR AMPLIFIER

(71) Applicant: Kenneth Gustave Roebke, Embarrass, MN (US)

(72) Inventors: Kenneth Gustave Roebke, Embarrass, MN (US); Rodney Dwaine Koivisto, Duluth, MN (US); Leroy Sheldon Johnson, Duluth, MN (US)

( * ) Notice: Subject to any disclaimer, the term of this patent is extended or adjusted under 35 U.S.C. 154(b) by 0 days. days.

(21) Appl. No.: 15/529,894

(22) PCT Filed: Nov. 24, 2015

(86) PCT No.: PCT/US2015/062344
§ 371 (c)(1),
(2) Date: May 25, 2017

(87) PCT Pub. No.: WO2016/085940
PCT Pub. Date: Jun. 2, 2016

(65) Prior Publication Data
US 2017/0264982 A1 Sep. 14, 2017

Related U.S. Application Data

(60) Provisional application No. 62/084,250, filed on Nov. 25, 2014.

(51) Int. Cl.
*H04R 1/02* (2006.01)
*H03G 5/02* (2006.01)
(Continued)

(52) U.S. Cl.
CPC ............. *H04R 1/025* (2013.01); *H03G 5/025* (2013.01); *H04R 1/403* (2013.01); *H04R 3/04* (2013.01);
(Continued)

(58) Field of Classification Search
CPC .......... H04R 1/025; H04R 1/403; H04R 3/12; H04R 3/04; H04R 2201/025; H04R 2201/028; H03G 5/025
See application file for complete search history.

(56) References Cited

U.S. PATENT DOCUMENTS 3,860,755 A * 1/1975 Kimbell ................ H04R 1/021
181/155
4,070,546 A 1/1978 Hirota
(Continued)

FOREIGN PATENT DOCUMENTS

EP 1142447 B1 2/2004

OTHER PUBLICATIONS

International Preliminary Report on Patentability for corresponding International Application No. PCT/US2015/062344 dated Jun. 8, 2017.
(Continued)

*Primary Examiner* — Brenda C Bernardi
(74) *Attorney, Agent, or Firm* — Patterson Thuente Pedersen, P.A.

(57) ABSTRACT

A portable amplifier is disclosed. In embodiments, the portable amplifier comprises a cabinet that opens and closes on a diagonal to contain all internal components, and optimizes sound quality. In embodiments the portable amplifier can be connected to an extension cabinet in order to provide an additional speaker. The portable amplifier can function on AC or DC power, and features user-friendly lighted ports and controls. The amplifier can feature AlNiCo speakers and a three-spring reverb tank. The portable amplifier can be optimized for weight and power to achieve output of about 4 to about 5 watts per pound.

20 Claims, 25 Drawing Sheets

(51) Int. Cl.
  *H04R 1/40* (2006.01)
  *H04R 3/04* (2006.01)
  *H04R 3/12* (2006.01)

(52) U.S. Cl.
  CPC ......... *H04R 3/12* (2013.01); *H04R 2201/025* (2013.01); *H04R 2201/028* (2013.01)

(56) References Cited

U.S. PATENT DOCUMENTS

| | | |
|---|---|---|
| 5,161,771 A | 11/1992 | Domeier |
| 5,590,771 A | 1/1997 | Cota |
| 5,933,507 A | 8/1999 | Woolley et al. |
| D474,761 S | 5/2003 | Zhang |
| 7,711,135 B2 | 5/2010 | Tsutsumi |
| 7,796,774 B2 | 9/2010 | Albert |

OTHER PUBLICATIONS

International Search Report for corresponding International Application No. PCT/US2015/062344 dated Feb. 5, 2016; 2 pages.
Written Opinion of the International Searching Authority for corresponding International Application No. PCT/US2015/062344 dated Feb. 5, 2016; 8 pages.
Amplivox, "SW915 Digital Audio Travel Partner," (May 12, 2013); 13 pages. Retrieved from the internet on Jan. 14, 2016 <www.ampli.com/pdf/oper-915.pdf>.
Crate, "V-Series tube amplifier," (Aug. 27, 2003); 13 pages. Retrieved from the internet on Jan. 14, 2016 <www.crateamps.com.pdf/manuals/v18-112_om.pdf.
Dayton Audio DTA-1 Class T Digital AC/DC Mini Amplifier 15 WPC, 10 pages. Retrieved from the internet on Jun. 12, 2014 https://www.parts-express.com/dayton-audio-dta-1-class-t-ac-dc-battery-powered-mini-amplifier-15-wpc--300-380.
Pignose Legendary 7-100 Portable Amp, 5 pages. Retrieved from the internet on Jun. 12, 2014 http://www.musiciansfriend.com/amplifiers-effects/pignose-legendary-7-100-portable-amp#productDetail.

* cited by examiner

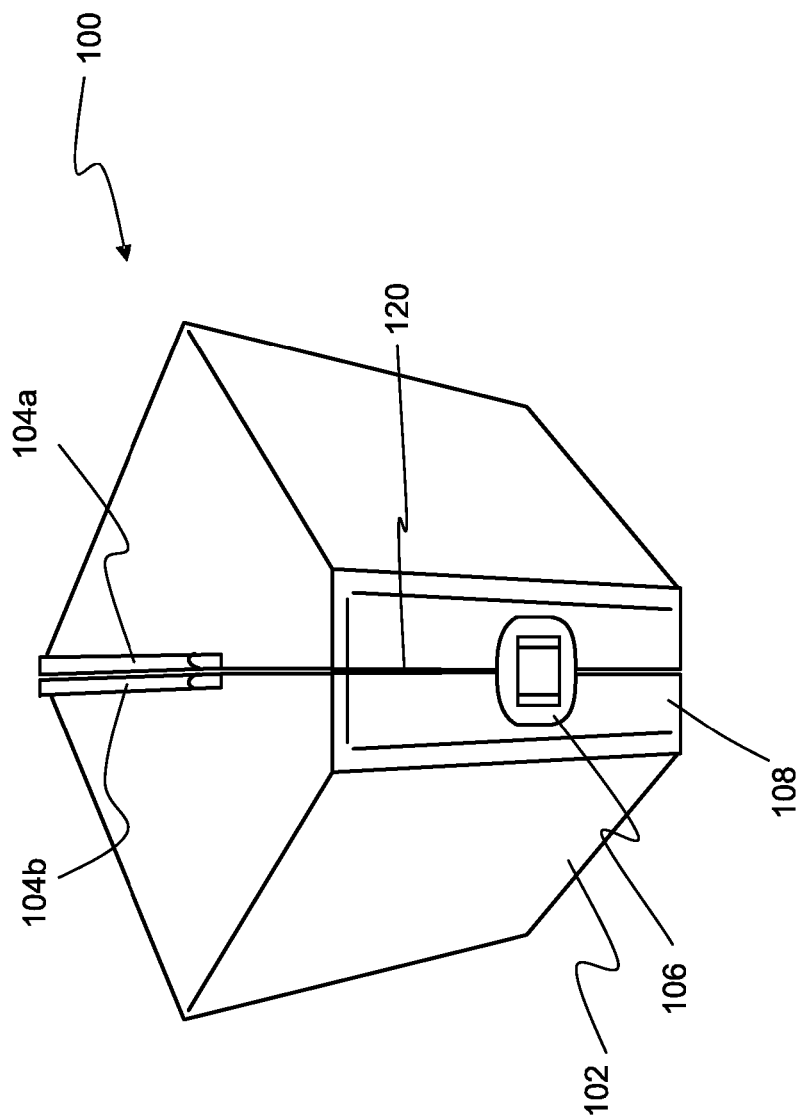

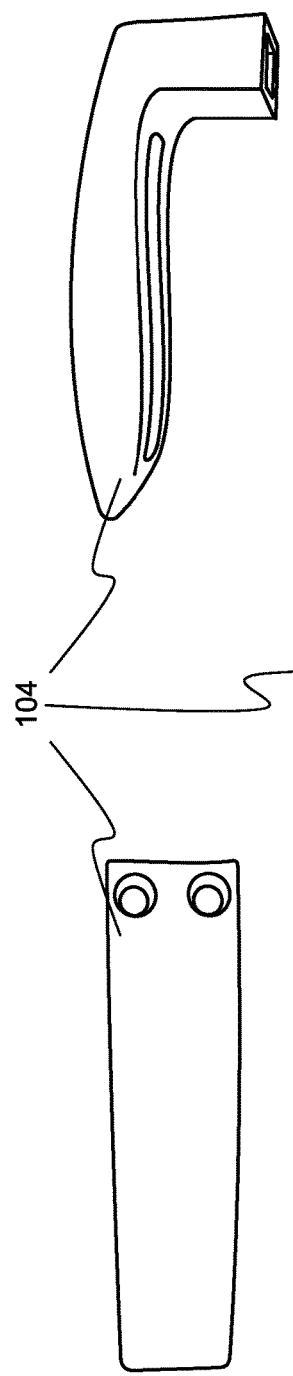
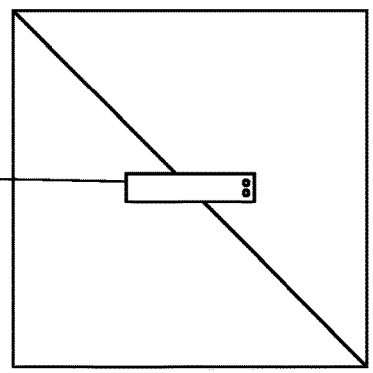
FIG. 2A   FIG. 2B   FIG. 2C

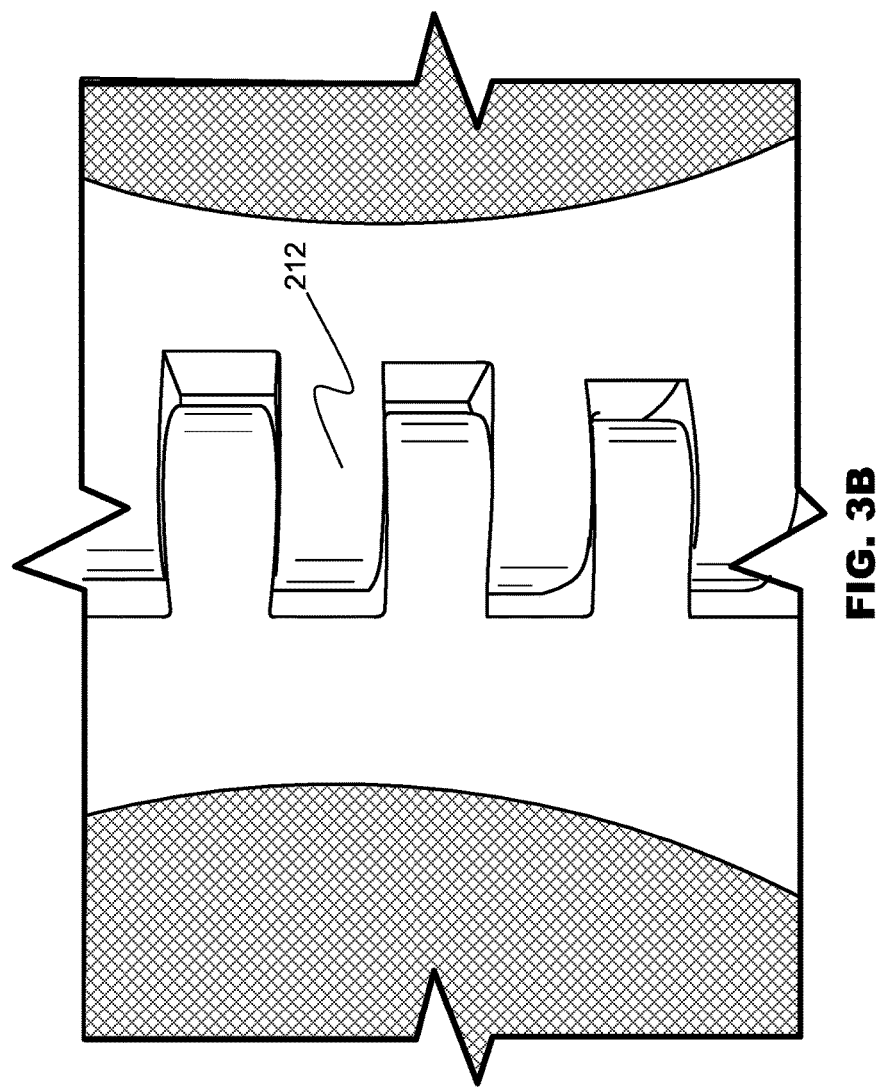

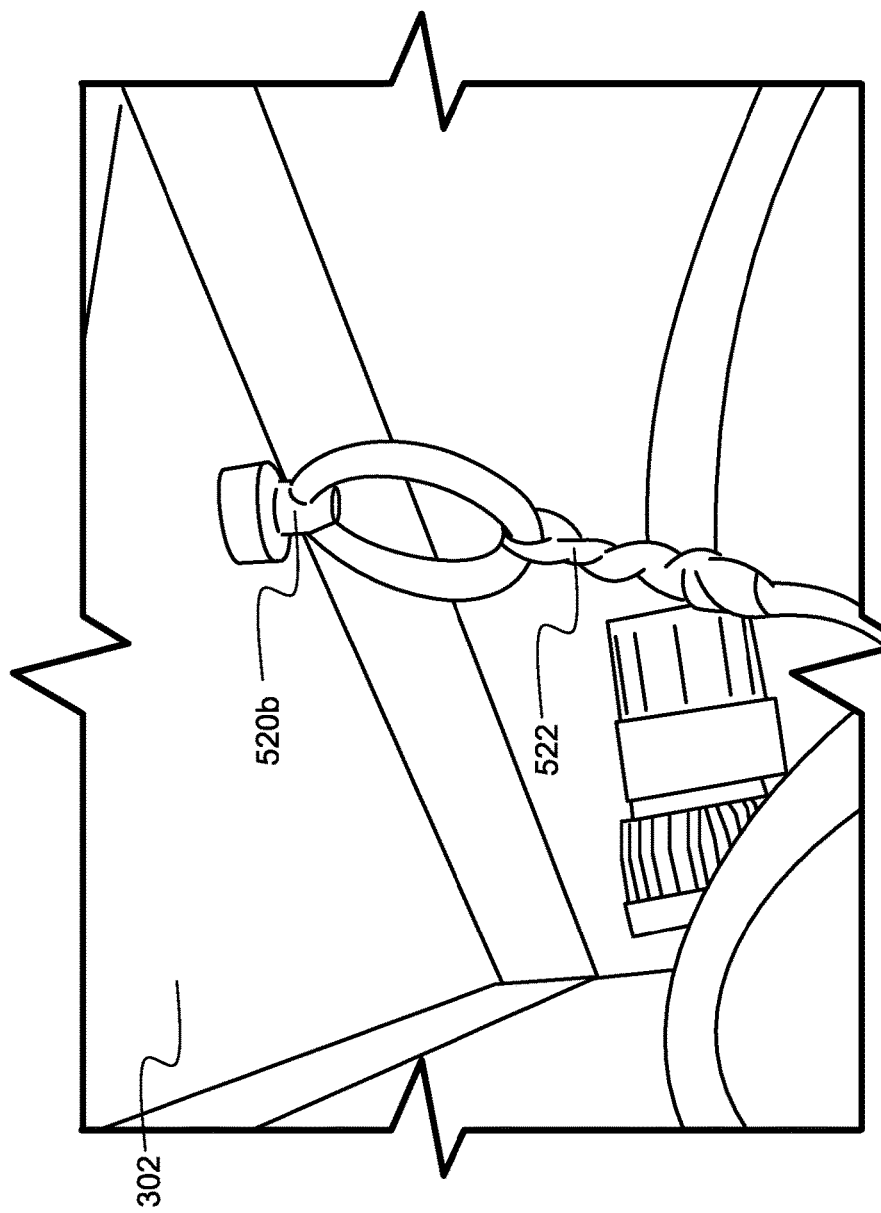

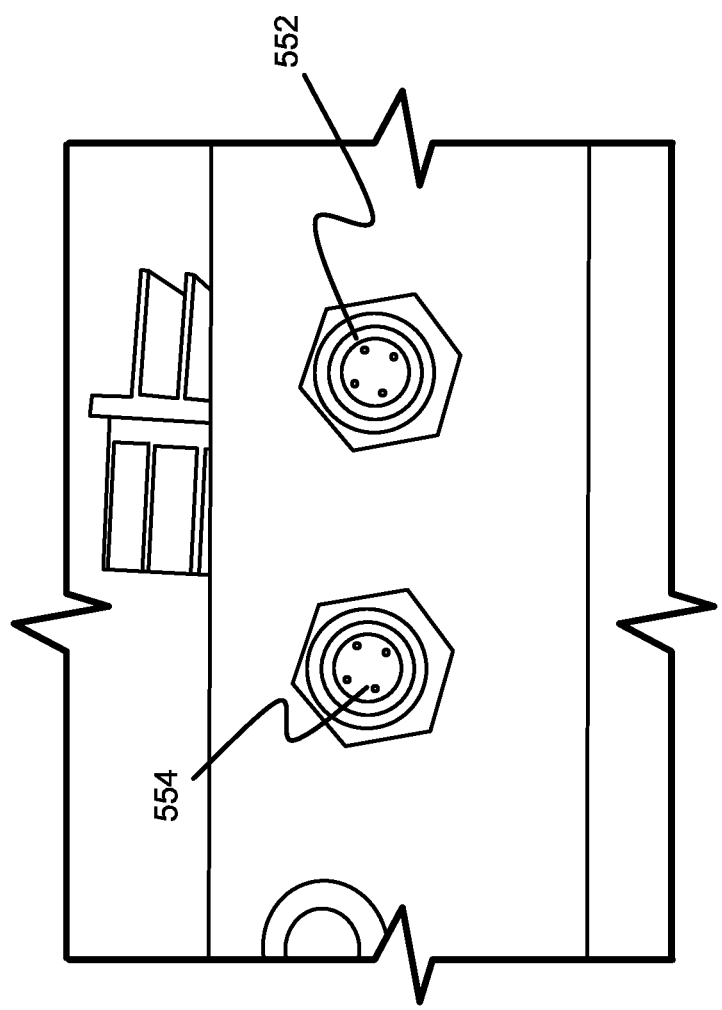

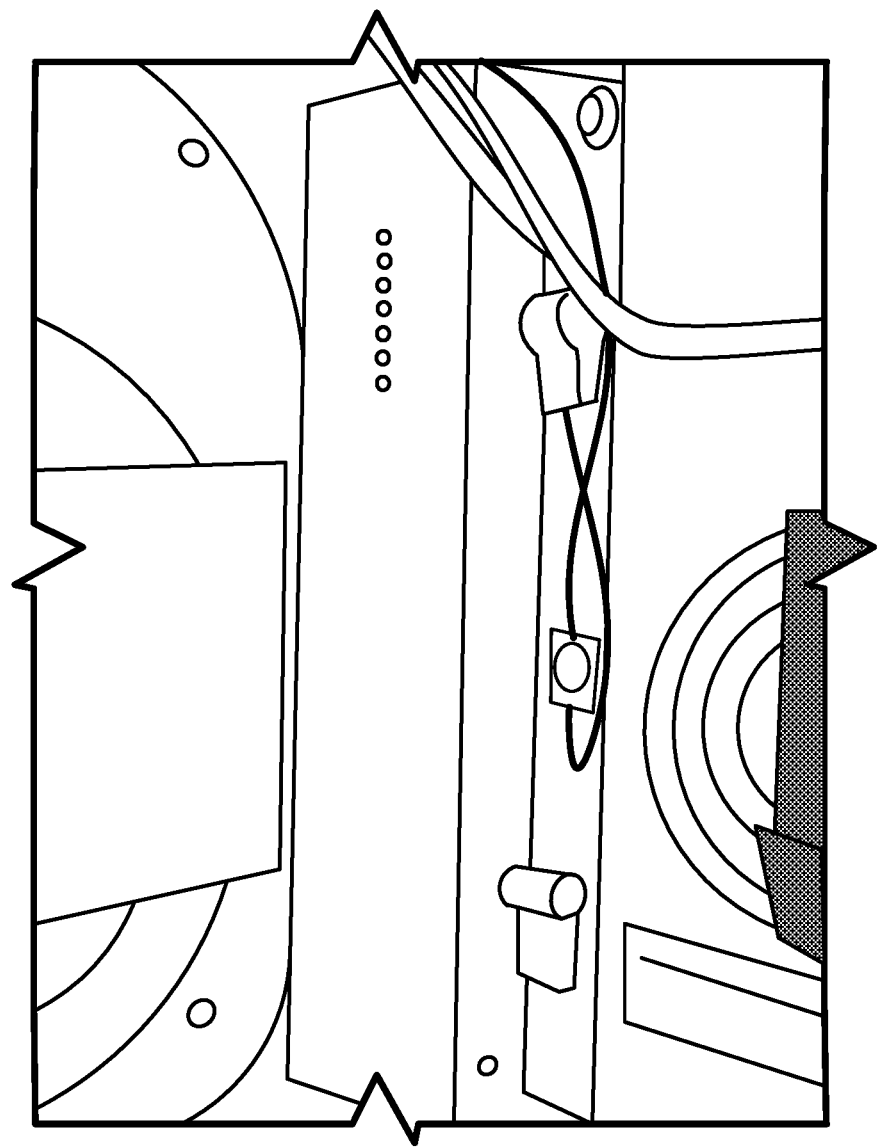

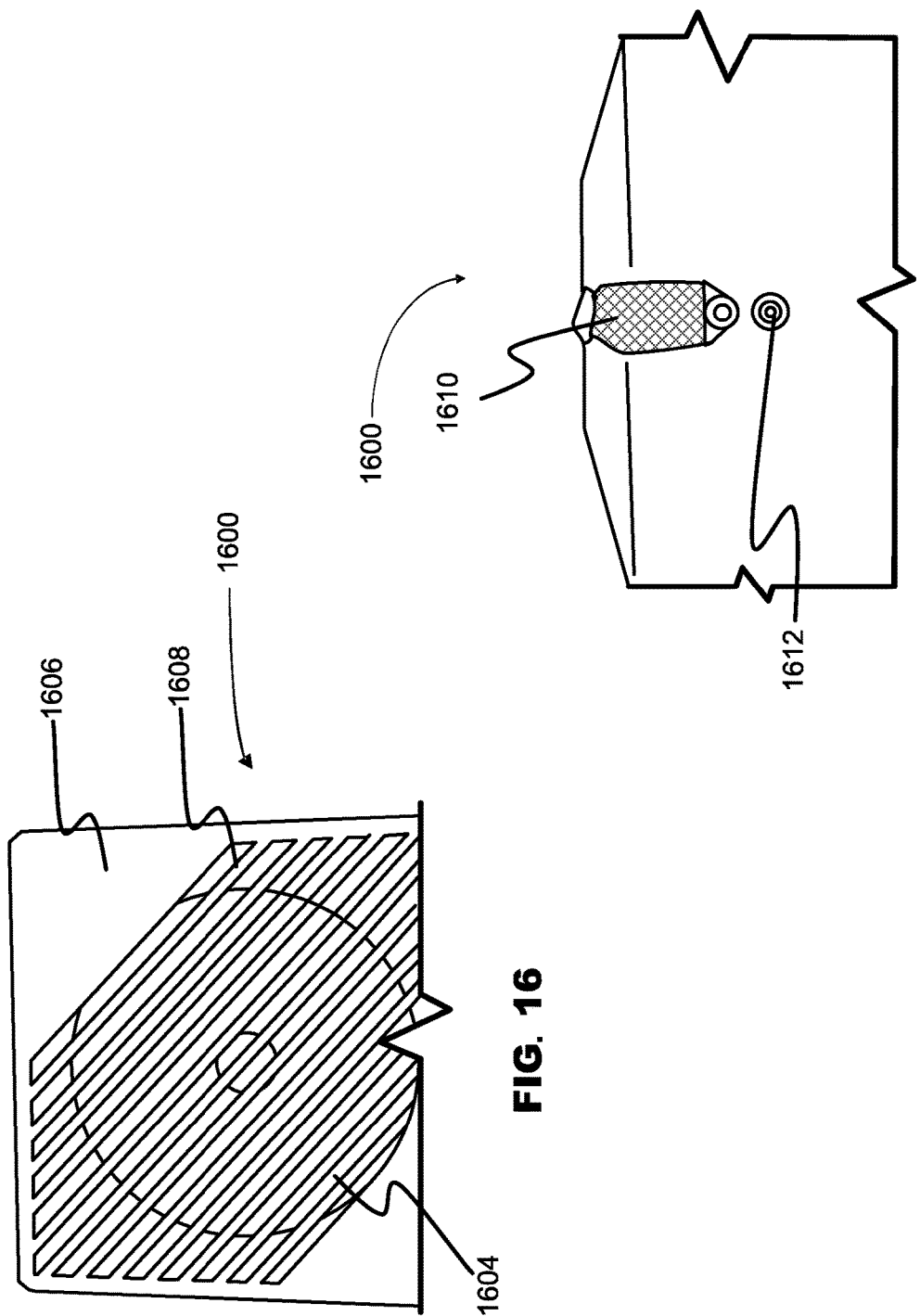

PORTABLE GUITAR AMPLIFIER

RELATED APPLICATION

The present application is a National Phase entry of PCT Application No. PCT/US2015/062344, filed on Nov. 24, 2015, which claims the benefit of U.S. Provisional Patent Application No. 62/084,250 filed Nov. 25, 2014, which are incorporated herein by reference in their entirety.

TECHNICAL FIELD

The present disclosure relates to the field of amplifiers for electronic instruments, specifically portable amplifiers optimized for weight and sound quality.

BACKGROUND

Guitar amplifiers (also known as "amps") amplify the sound produced by electric guitars, bass guitars, and acoustic guitars or other instruments. Many amplifiers are built into cabinets that also contain integrated loudspeakers. These combination units are also often referred to simply as "amplifiers" or "amps."

Combination amplifiers are used in a number of situations. Musicians can use them for solo or group practice, and also for live performances, or gigs. Because of this, it is often desirable for guitar amplifiers to be portable; portability, however is often at odds with performance in terms of sound quality, acoustic power, battery life, and other features. Therefore, musicians often require multiple amplifiers for different situations.

Originally, all amplifiers were constructed using vacuum tubes. These "tube amps" provided a warm and rich sound that is still preferred by many musicians. Vacuum tubes are large and unwieldy, however, and tube amps are often quite heavy and not portable. While semi-conductors are able to replicate many of the functions of vacuum tubes, and some musicians prefer the purer sound of solid-state amplifiers, the tube amp "sound" is the acoustic goal that most amplifiers attempt to meet.

Amplifiers with open and closed back cabinets are known in the art. The sound produced by closed-back cabinets is more directional because the sound is not able to travel as easily out of the sides or back of the amplifier. In addition, closed-back cabinets produce a tighter bass response. In contrast, open-back cabinets are less directional because sound can issue from the front and back of the enclosure, making the sound seem to come from all around the amplifier. This can allow other musicians to hear the amplifier better.

Because of their weight, even some musicians who would prefer a tube amplifier will select a more portable, solid-state amplifier. Conventional portable amplifiers have a number of limitations. Amplifiers that are optimized for weight often sacrifice sound quality by being made of materials that are less acoustically ideal, such as plastic. These amplifiers often only have one speaker driver.

SUMMARY

Embodiments relate to amplifiers for electronic instruments, and more particularly to lightweight portable amplifiers that have true recording studio sound capable of capturing qualities such as warmth, clarity and volume desired by guitarists and other musicians.

One embodiment is an amplifier with a hinged cabinet design. The hinged cabinet allows all controls, cords and batteries to be concealed within the cabinet when closed, providing convenience and security for transportation. In addition, when opened, the cabinet doubles in size which broadens the sound dispersion. The amplifier has dual speaker drivers.

Another embodiment comprises a single speaker driver that can be electronically connected to an extension cabinet comprising a second speaker driver.

In some embodiments, the amplifier is capable of producing about 112 watts RMS, with a total sound output of about 116 decibels. Note that throughout this disclosure, "watts RMS" is used to mean the continuous average power in watts calculated from a measurement of the root-mean-square (RMS) voltage. "Watts RMS" is also known in the art as "average sine wave power." The disclosed device can weigh as little as about 23 pounds, producing a power to weight ratio in a range of about 4 to about 5 watts per pound, such as about 4.87 watts per pound in one embodiment. The amplifier can use either alternating current (AC) or direct current (DC) battery power, and the volume produced can be the same from either AC or batteries. The batteries can be capable of lasting for up to about 4 hours of use. The amplifier has a four-band equalizer (EQ), allowing for split midrange control and user friendly lit controls and inputs, allowing the user to make adjustments and plug in, even in total darkness.

BRIEF DESCRIPTION OF THE DRAWINGS

The invention may be more completely understood in consideration of the following detailed description of various embodiments of the invention in connection with the accompanying drawings, in which:

FIG. 1 is a perspective view of the rear side of a closed portable amplifier according to an embodiment.

FIG. 2A is a perspective view of the top side of an alternative handle for a portable amplifier according to an embodiment.

FIG. 2B is a perspective view of the side of an alternative handle for a portable amplifier according to an embodiment.

FIG. 2C is a plan view of the top side of an alternative handle for a portable amplifier according to an embodiment.

FIG. 3B is a perspective view of the front side of a portable amplifier showing details of the hinge teeth according to an embodiment.

FIG. 7B is a perspective view showing detail of the interior of a portable amplifier according to an embodiment.

FIG. 7D is a perspective view of the power inputs of a portable amplifier according to an embodiment.

FIG. 15 is a perspective view showing detail of the interior of the portable amplifier of FIG. 11.

FIG. 16 is a perspective view of the front side of an extension cabinet according to an embodiment.

FIG. 17 is a perspective view of a side of an extension cabinet according to an embodiment.

DETAILED DESCRIPTION

Figure 3A:
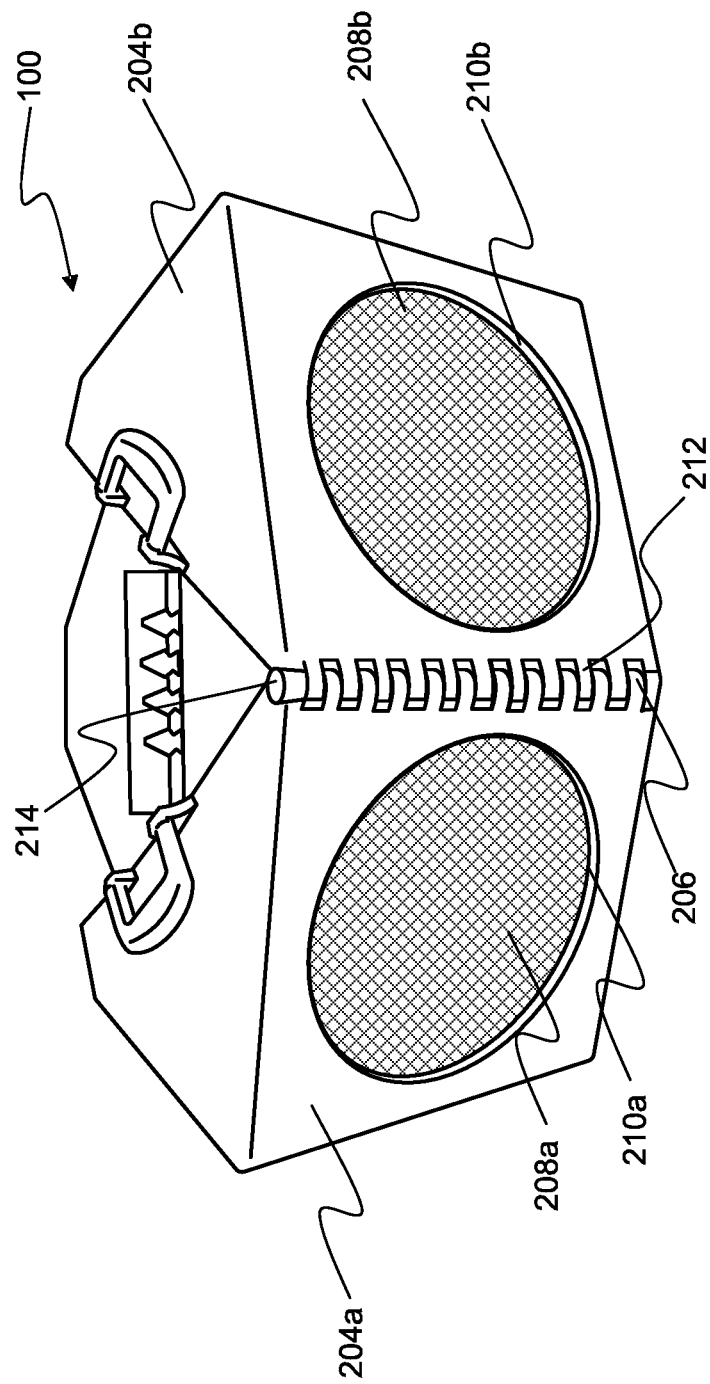
FIG. 3A is a perspective view of the rear side of an open portable amplifier according to an embodiment.

Various embodiments may be embodied in other specific forms without departing from the essential attributes thereof; therefore, the illustrated embodiments should be considered in all respects as illustrative and not restrictive.

Embodiments of a portable amplifier comprise two external facing speakers and a hinged cabinet. Referring to FIG. 1, an amplifier 100 is depicted in a closed configuration. Amplifier 100 comprises a cabinet 102, handle 104, and a latch 106. When cabinet 102 is closed, amplifier 100 can form, approximately, a 14-inch cube, with one corner facet 108 and a diagonal opening 120. Amplifier 100 can be larger, smaller, or differently shaped or proportioned in other embodiments.

Corner facet 108 can include a latch 106. Latch 106 can comprise metal, plastic, or other rigid material known in the art. Latch 106 can comprise or interface with a lock in embodiments for enhanced security.

Handle 104 can comprise two portions 104a and 104b, each comprising hinges allowing them to lay flat against the top of cabinet 102 or be substantially perpendicular to the top surface of cabinet 102 for ease of carrying. In one embodiment (as shown in FIG. 1), handle 104 can be substantially U-shaped, C-shaped, or comprise another shape or configuration, such as one which is ergonomic and easy to grip. In another embodiment, as shown in FIGS. 2A-2C, handle 104 can be substantially l-shaped. Handle 104 can comprise plastic, metal, wood, or other materials known in the art.

Figure 10:
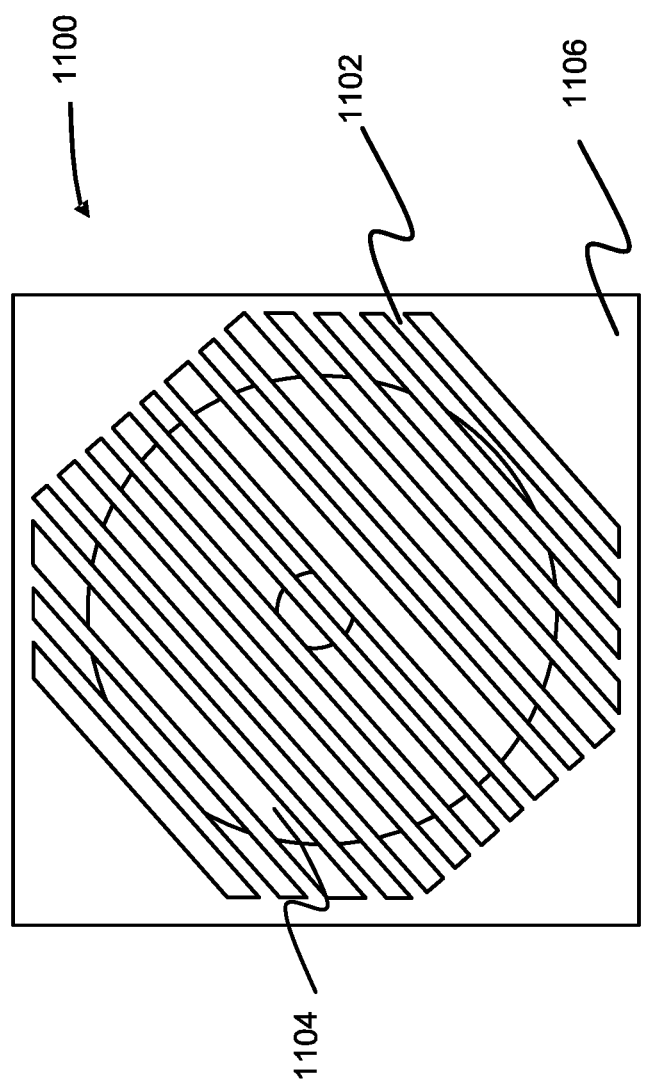
FIG. 10 is a perspective view of the front of an alternative portable amplifier according to an embodiment.

Referring to FIGS. 3A-3B, which depict amplifier 100 in a partially opened configuration, cabinet 102 comprises cabinet portions 204a and 204b. Cabinet portions 204a, 204b are connected via hinge 206. Speaker grilles 208a and 208b are situated within speaker openings 210a and 210b in cabinet portions 204a, 204b. Speaker openings 210a, 210b can be circular as depicted, approximately twelve inches in diameter in embodiments, or they can be differently sized in other embodiments. Speaker openings 210a, 210b can also have other shapes in other embodiments. Speaker grilles 208a, 208b can comprise fabric, mesh, or some other suitable sound transmitting material. As can be seen in FIG. 10, speaker grilles 208a, 208b can also comprise a similar material as cabinet portions 204a, 204b and present slats 1102. The slats 1102 can be substantially rectangular, v-shaped, or arranged in some other configuration that provides an attractive appearance, protects the speaker hardware, provides enhanced sound features, or provides one or more other benefits.

Hinge 206 can comprise interlocking teeth 212 that can be attached to or formed into cabinet portions 204a 204b. Interlocking teeth 212 can be coupled by a hinge cylinder 214, creating a rotatable connection between cabinet portions 204a, 204b. Interlocking teeth 212 can be seen in further detail in FIG. 3B.

Figure 4B:
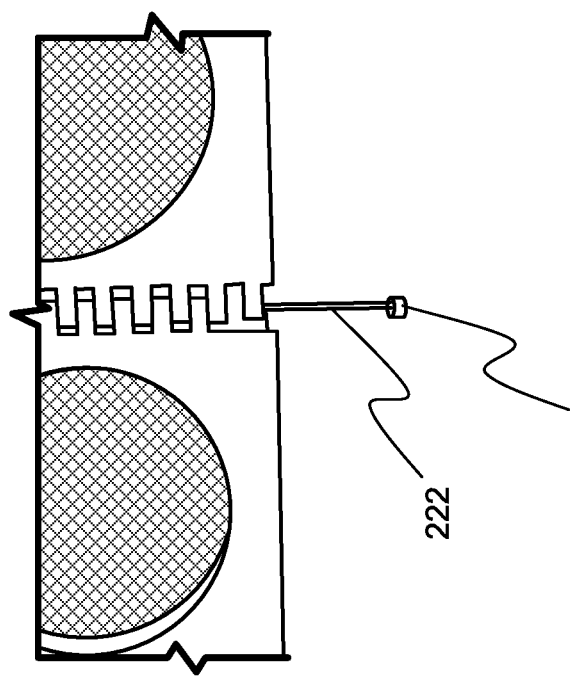
FIG. 4B is a perspective view of the front side of a portable amplifier in a tilt-back configuration according to an embodiment.
Figure 4A:
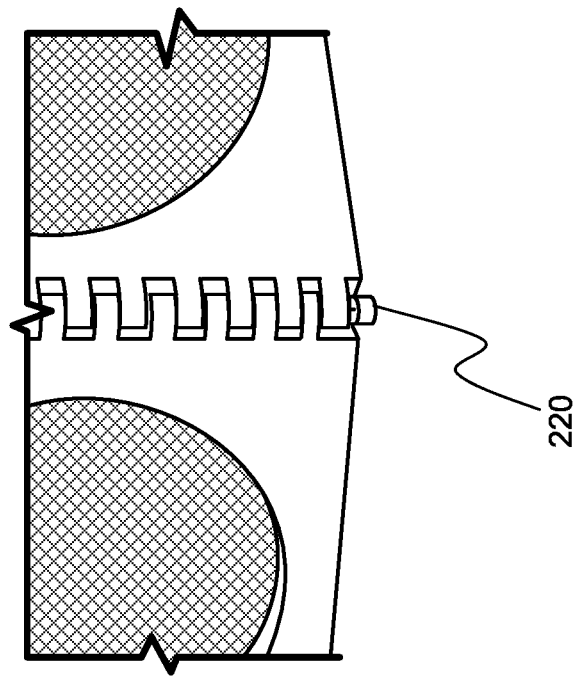
FIG. 4A is a perspective view of the front side of a portable amplifier showing indicating a foot according to an embodiment.

Referring to FIGS. 4A and 4B, hinge cylinder 214 can comprise foot 220 and leg 222. Foot 220 can comprise rubber, plastic, or other material suitable to protect the surface that amplifier 100 is placed on. Leg 222 can comprise metal, plastic, or other material of sufficient compressive and shear strength to allow amplifier 100 to tilt back. Leg 222 can be rotatably attached to hinge cylinder 206 allowing leg 222 to unscrew to a desired length.

Cabinet portions 204a, 204b can comprise a variety of different materials that provide enhanced acoustic properties and is lightweight. Example materials include basswood, balsam, pine, cherry, or zebra wood lumber, plywood, or particleboard. Other possible materials include plastics, metals, or other materials. In one embodiment, the use of lumber as opposed to plywood or particleboard eliminates the need for a heavy covering such as Tolex used in conventional amplifiers. Cabinet portions 204a, 204b can be stained, painted, covered, or provided with other finishes known in the art in order to preserve aesthetic qualities and protect the base material and contents of amplifier 100.

Figure 5:
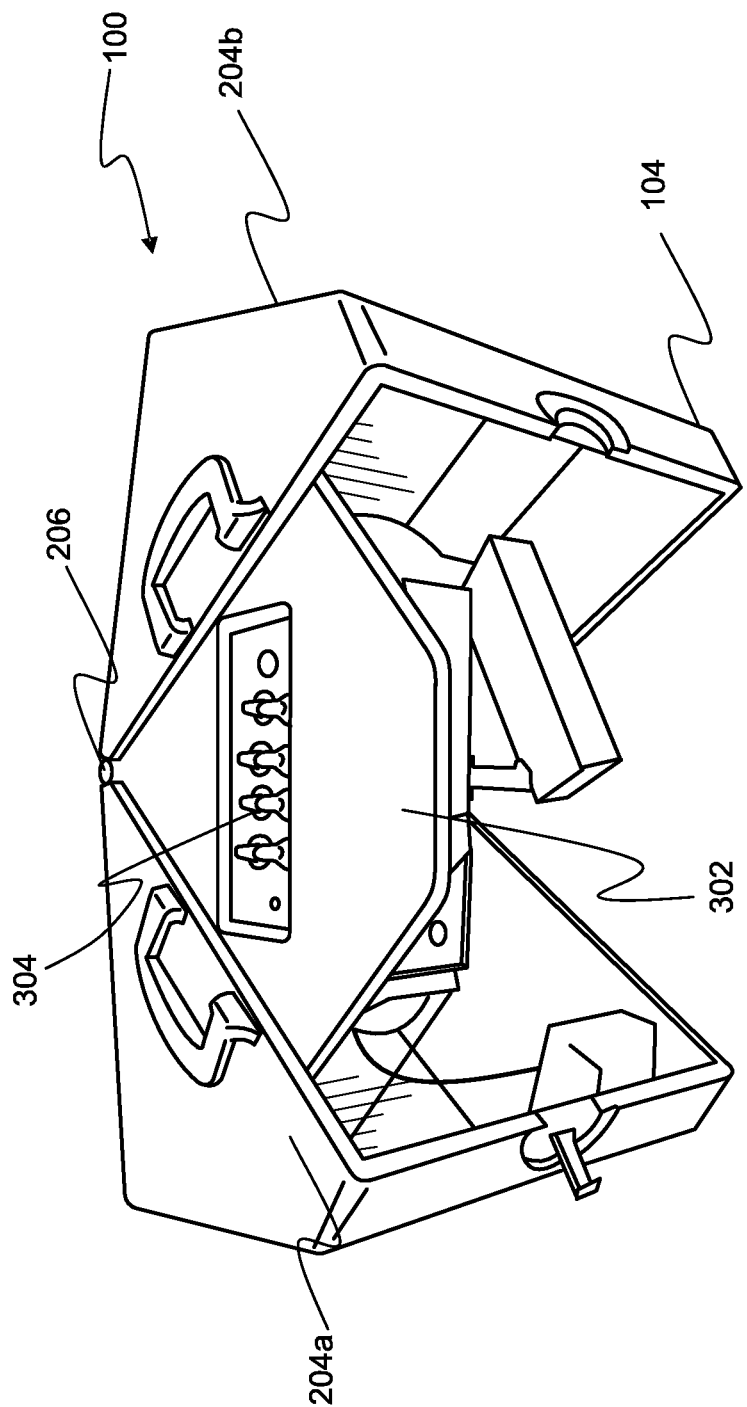
FIG. 5 is a perspective view of the rear side of a partially open portable amplifier according to an embodiment.
Figure 7A:
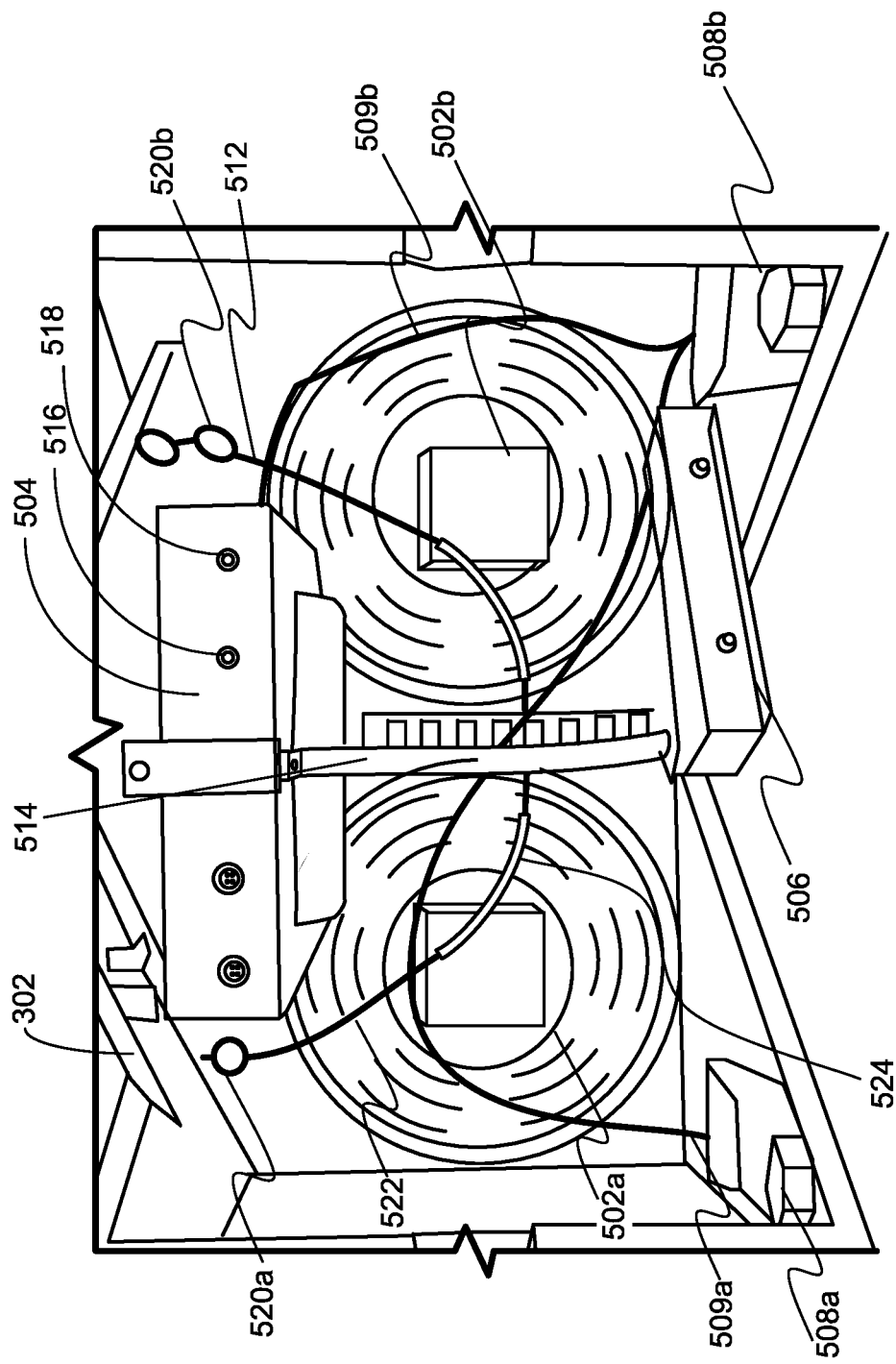
FIG. 7A is a perspective view of the interior of a portable amplifier according to an embodiment.

Referring now to FIG. 5, which depicts a rear view of amplifier 100 when opened, amplifier 100 further comprises a top shelf 302. In one embodiment top shelf 302 is a five-sided polygon resembling a square with a flattened corner, though top shelf 302 can have some other shape so long as it generally has dimensions allowing it to fit completely within cabinet 102 when amplifier 100 is closed. In one embodiment, the flattened corner of top shelf 302 faces the rear of amplifier 100 and is adjacent to corner facet 108 when amplifier 100 is closed. The corner of top shelf 302 that is diagonally opposite corner facet 108 can be rotatably connected to cabinet portions 204a, 204b via hinge 206. Top shelf 302 can comprise the same material as cabinet portions 204a, 204b, or a different material. Top shelf 302 comprises control panel 304. Control panel 304 can be recessed into top shelf 302 and is electronically connected to mixing unit 516 (see FIG. 7A).

Figure 6:
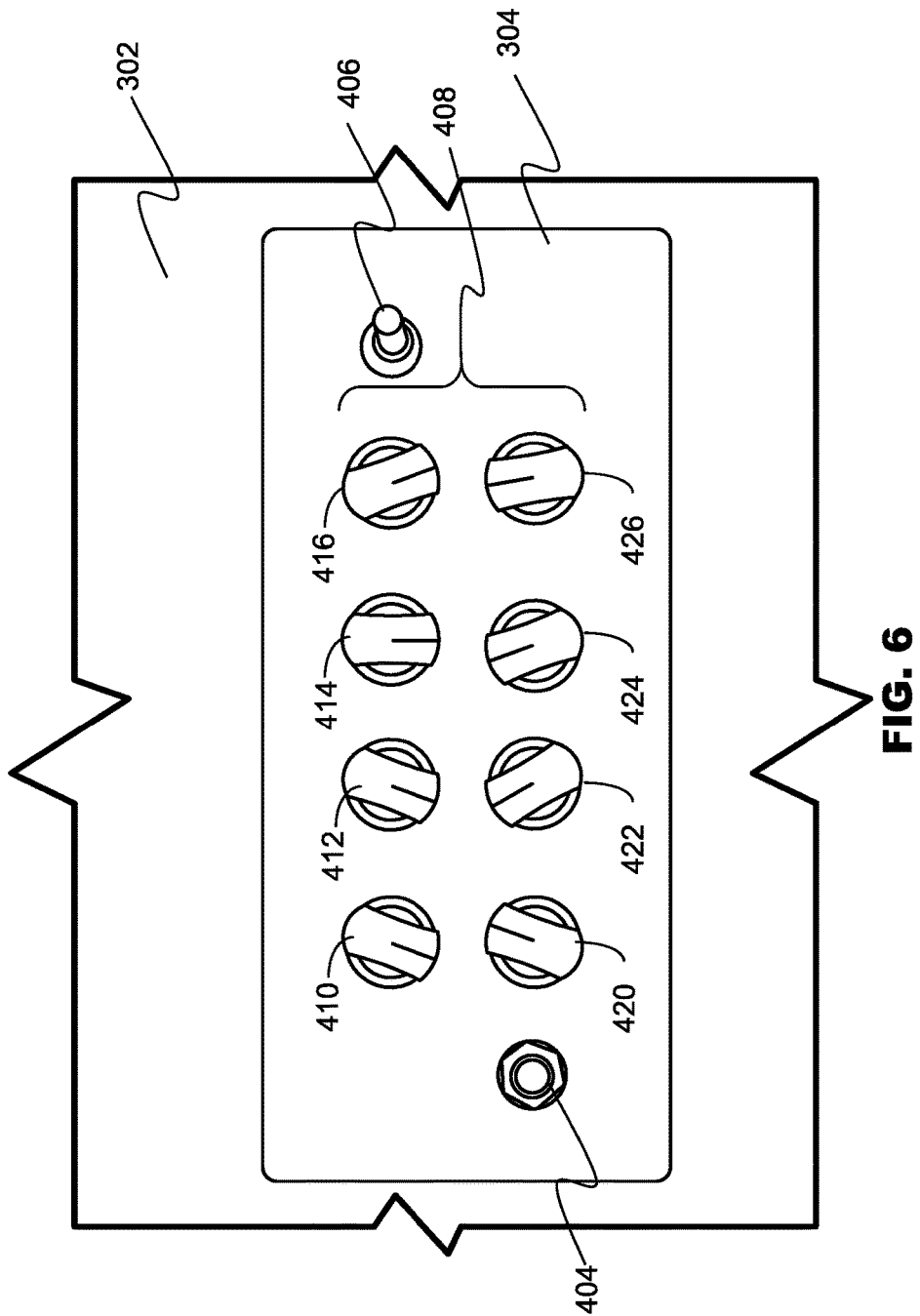
FIG. 6 is a perspective view of the top side of the control panel of a portable amplifier according to an embodiment.

FIG. 6 shows control panel 304 in more detail. Control panel 304 can comprise one or more input ports 404 and output ports (not shown). Input ports 404 and output ports can be configured to receive standard audio plugs including, but not limited to, 3.5 mm, 2.5 mm, or 6.35 mm (¼") plugs for mono (TS) or stereo (TRS) connections. Ports 404 can be comprise one or more light sources (not shown) recessed underneath control panel 304 which can comprise light-emitting diodes (LEDs) in an embodiment. The light sources can produce low-intensity violet, or other colors of light, and different components of control panel 304 can be lit with different colors to provide easy differentiation in dark or low-light environments.

Control panel 304 can comprise a main power switch 406. Power switch 402 can be a toggle switch, knife switch, button switch or any other switch style known in the art capable of expressing at least two states. Power switch 402 can comprise an LED or other small, low-power light source integrated into the switch itself or underneath control panel 304.

Control panel 304 can also comprise one or more controls 408 to allow the user to set or adjust properties for the desired sound output. Controls 408 can be potentiometers or other analog or digital inputs known in the art. Controls 408 can include treble 410, high midrange 412, low midrange 414, and bass 416 in one embodiment. Controls 408 can also include input volume 420, gain 422, master (output) volume 424, and reverb 426. Still other functions can be controlled by controls 408 in other embodiments, such that control panel 304 can comprise more or fewer controls 408 in other embodiments. Controls 408 can comprise light sources. In an embodiment, the user operable portion of each control 408 comprises a transparent or translucent material, and an LED or other small, low-power light source can be contained within the hollow body of the control.

Referring now to FIGS. 7A-7D which depict the inside of an open amplifier 100 from the rear, amplifier 100 further comprises speaker drivers 502a and 502b, mixing unit 504, reverb tank 506, battery ports 508a and 508b, battery cables 509a and 509b, and stabilizing mechanism 512.

Speaker drivers 502a, 502b can be arranged behind speaker openings 210a, 210b (see FIG. 3A). Speaker drivers 502a, 502b can be coupled to cabinet portions 204a, 204b via screws or other fasteners. Speaker drivers 502a, 502b can feature AlNiCo (Aluminum-Nickel-Cobalt) magnet for power efficiency and superior sound quality. Conventional portable amplifiers often use ceramic drivers which are 70% efficient and produce sound with a brittle top level. AlNiCo drivers, however, can be 98.5% efficient and produce a warm sound and therefore are used in embodiments of amplifier 100. Speaker drivers 502a, 502b are electrically connected to mixing unit 504 via output amplification ICs 920a and 920b (see FIG. 9). Output amplification ICs 920a and 920b can each comprise 56 W amplifiers such that the total power output from amplifier 100 can be 112 watts RMS, though the total power output can be lower or higher in other embodiments.

Mixing unit 504 can be fixedly connected to the underside of top shelf 302. Mixing unit 504 can also be fixedly connected to cabinet 102 via bracket 514. Mixing unit 504 can comprise reverb ports 516 and 518 to provide electrical connection to reverb tank 506. Mixing unit 504 can present a four-band equalizer allowing for a split midrange (low midrange and high midrange). In three-band amplifiers with only one midrange control, users can encounter tonal trouble spots that can be avoided with the split midrange.

Battery ports 508a, 508b can be attached to cabinet portions 204a, 204b and be electrically connected to mixing unit 504 via battery cables 509a, 509b. Battery cables 509a, 509b can be connected in series such that battery cable 509a connects battery port 508a to battery port 508b and battery cable 509b connects battery port 508b to mixing unit 504. Stabilizing mechanism 512 comprises stabilizing pins 520a, 520b and closure cable 522.

Stabilizing pins 520a 520b are fixedly connected to top shelf 302 and extend through top shelf 302 to engage stabilizing holes (not shown) in cabinet portions 204a, 204b. Closure cable 522 can comprise braided waxed thread, wire, or some other flexible connector of similar tensile strength that is able to withstand vibration. Closure cable 522 can be partially wrapped in protective covering 524 to protect closure cable 524 and prevent vibration. Protective covering 524 can comprise heat shrink tubing, electrical tape, fabric tape, duct tape, or some other material capable of protecting closure cable 524. Stabilizing pin 520b and closure cable 522 can be seen in more detail in FIG. 7B.

Figure 7C:
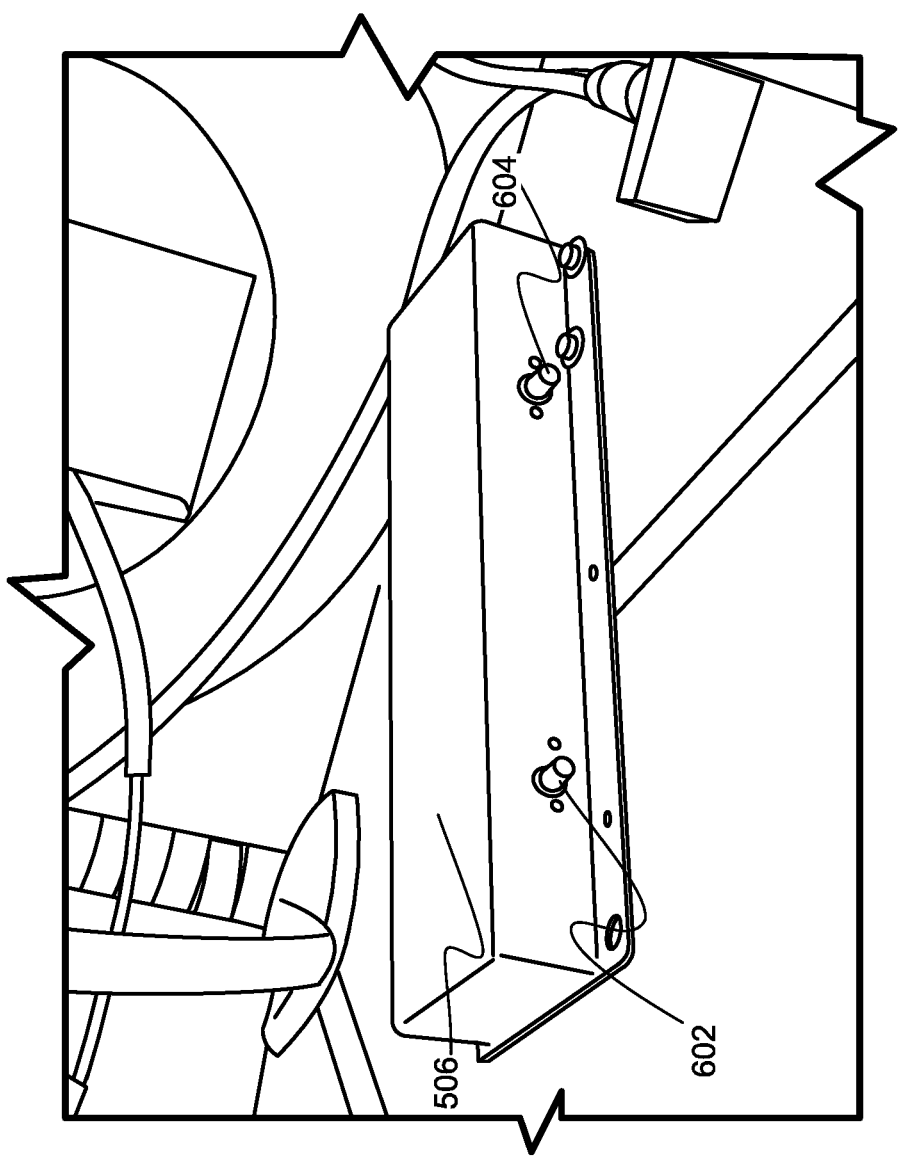
FIG. 7C is a perspective view of interior of a portable amplifier showing detail of the reverb tank according to an embodiment.

FIG. 7C is a detailed view of a reverb tank 506 of an embodiment. Two- and three-spring reverb tanks are known in the art, and reverb tank 506 can comprise be a three-spring reverb tank such as provided by Accutronics in one embodiment. Reverb tank 506 can be attached to cabinet portion 204b, or placed anywhere where it can be spaced apart from the power supplies in order to reduce noise. Reverb tank 506 can present reverb output 602 and reverb input 604 for electrical connection to mixing unit 504.

FIG. 7D is a detailed view of the power inputs of mixing unit 504. AC input 552 can comprise a 5-pin terminal, while DC input 554 can comprise a 4-pin terminal (excluding a ground pin). Input terminals of other sizes, shapes, and numbers of ports can of course be used.

Figure 8:
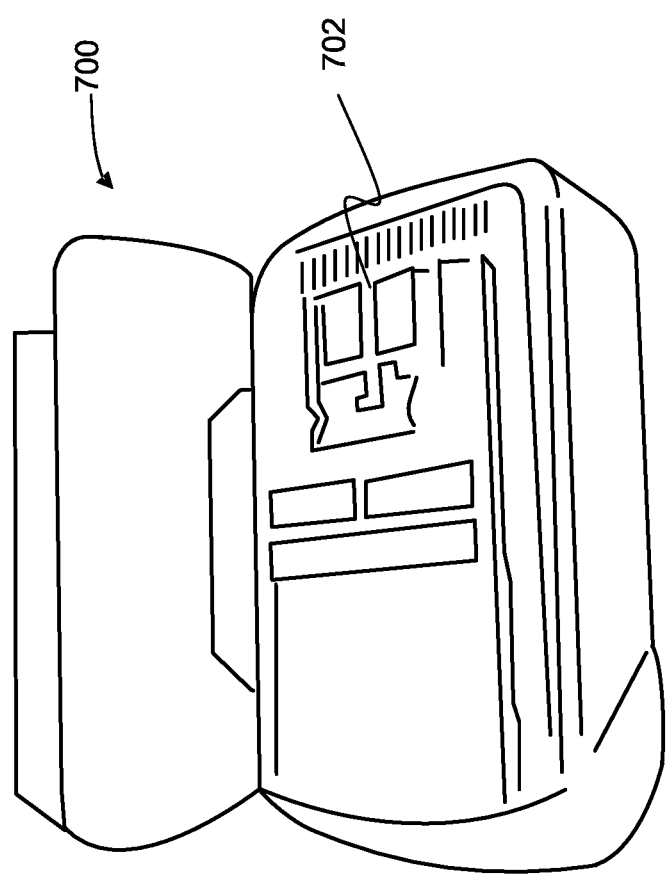
FIG. 8 is a perspective view of batteries compatible with a portable amplifier according to an embodiment.

FIG. 8 is a detailed view of the top and side of batteries 700 than can be used to provide DC power in accordance with embodiments. Batteries 700 can be any conventional batteries capable of producing sufficient voltage to support 112 watts RMS total output, or some other higher or lower desired total power output in other embodiments. More or fewer than two batteries can be used in various embodiments. Batteries 700 can comprise rechargeable batteries in some embodiments. Batteries 700 also can be repurposed from or interchangeable with other uses; for example, batteries 700 can be motorcycle or power tool batteries. Batteries 700 can comprise different chemistries, such as lithium-ion or nickel-metal hydride (NiMH). To save weight and provide better charging time and power output, lithium-ion rechargeable batteries can be used in embodiments. In one embodiment, two 36V Bosch lithium-ion batteries are used as batteries 700, though other battery types, sizes, and/or brands can be used in other embodiments. Batteries 700 also need not be identical to each other in embodiments. In one embodiment, batteries 700 present slots 702 allowing batteries 700 to be installed in battery ports 508a, 508b (shown in FIG. 6A). In an embodiment, one battery 700 can provide positive voltage, and a second battery 700 can provide negative voltage.

Figure 9:
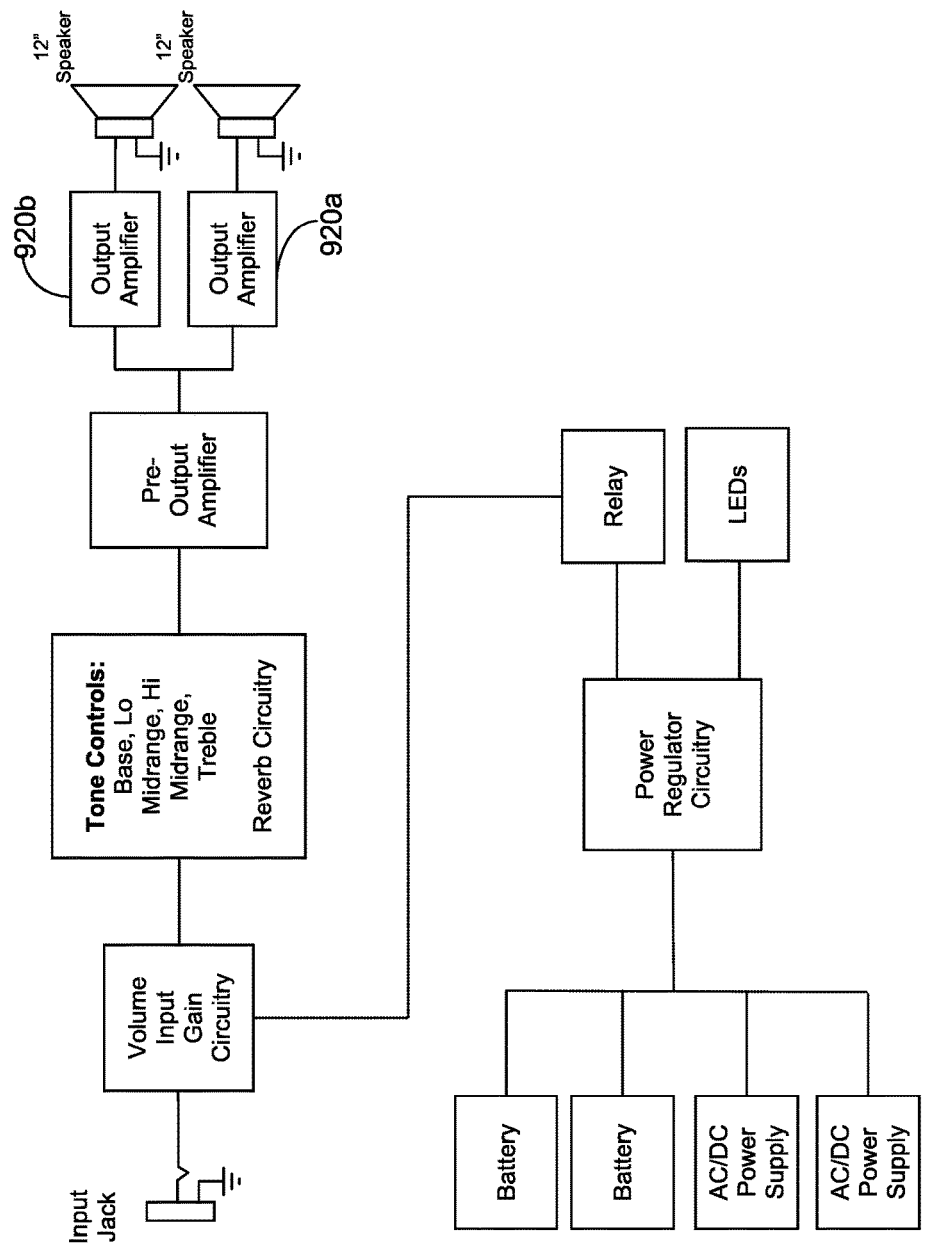
FIG. 9 is a block diagram of the circuitry of a portable amplifier according to an embodiment.

FIG. 9 provides a block diagram depicting the electrical connections between components of amplifier 100.

FIGS. 10-15 depict another embodiment of an amplifier 1100. Referring now to FIG. 10, amplifier 1100 comprises a single speaker driver 1104, in a cabinet 1106. Cabinet 1106 can form, approximately a 14-inch cube, but can be larger, smaller, or differently shaped or proportioned in other embodiments. Cabinet 1106 can comprise similar materials to cabinet portions 204a, 204b (see FIG. 3A). Cabinet 1106 can also be finished in a manner similar to cabinet portions 204a, 204b (see FIG. 3A).

Figure 11:
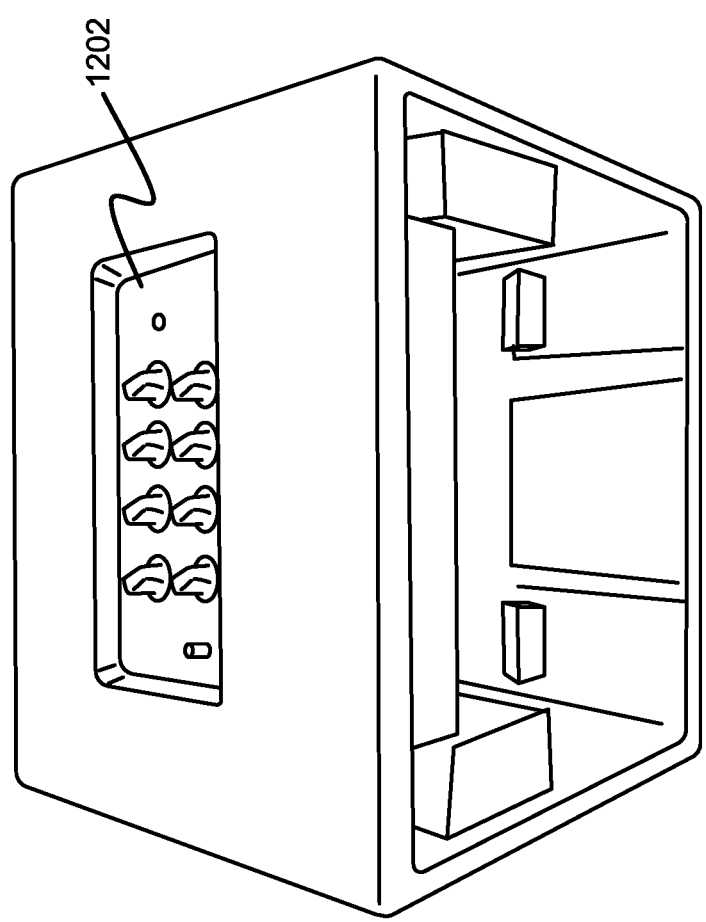
FIG. 11 is a perspective view showing the top and rear sides of the portable amplifier of FIG. 9.

Referring now to FIG. 11, amplifier 1100 can comprise a control panel 1202 substantially similar to control panel 304 (see FIG. 5). Though control panel 1202 is depicted on a top surface of amplifier 1100, it can be arranged on another surface in other embodiments.

Figure 12:
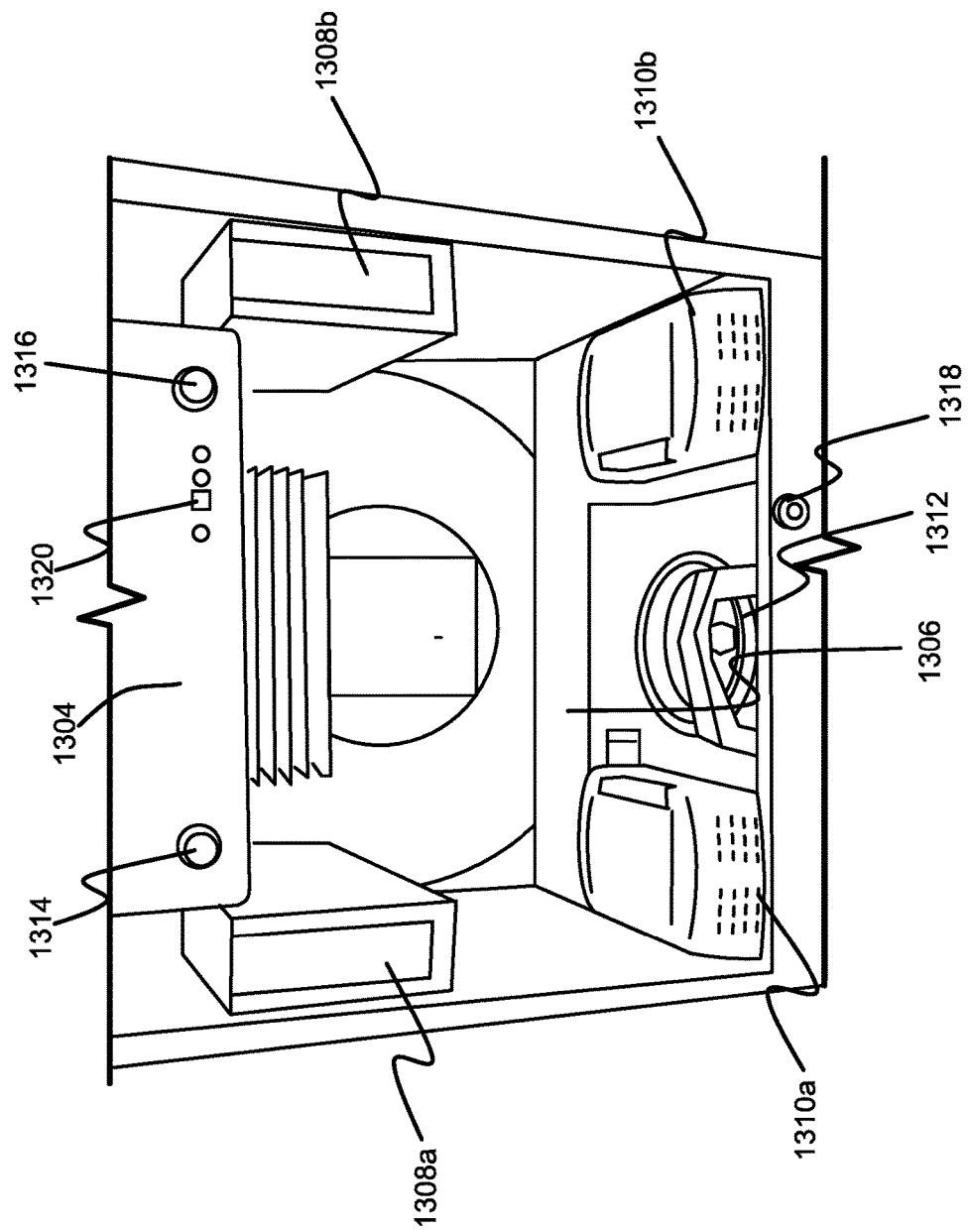
FIG. 12 is a perspective view showing the rear side and interior of the portable amplifier of FIG. 9.
Figure 13:
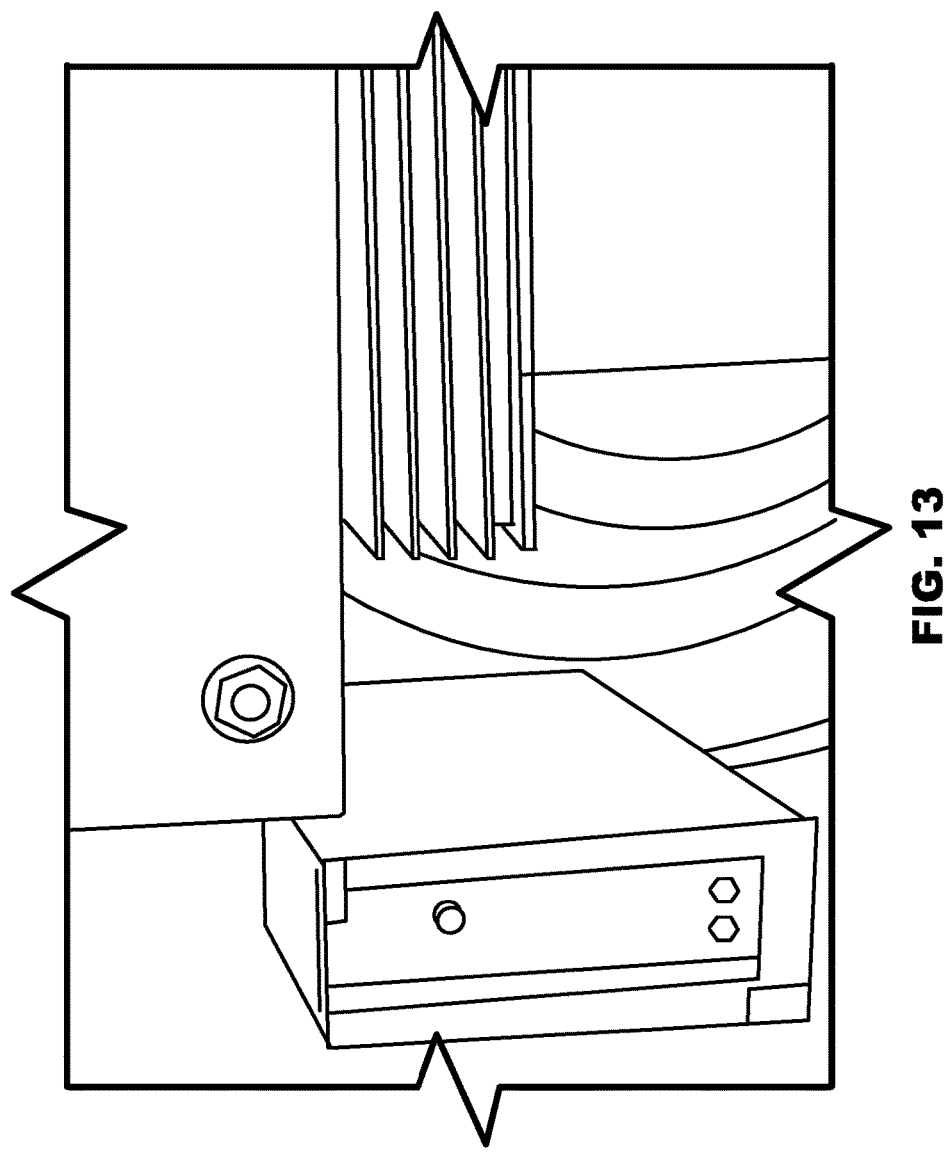
FIG. 13 is a perspective view showing detail of the interior of the portable amplifier of FIG. 9.
Figure 14:
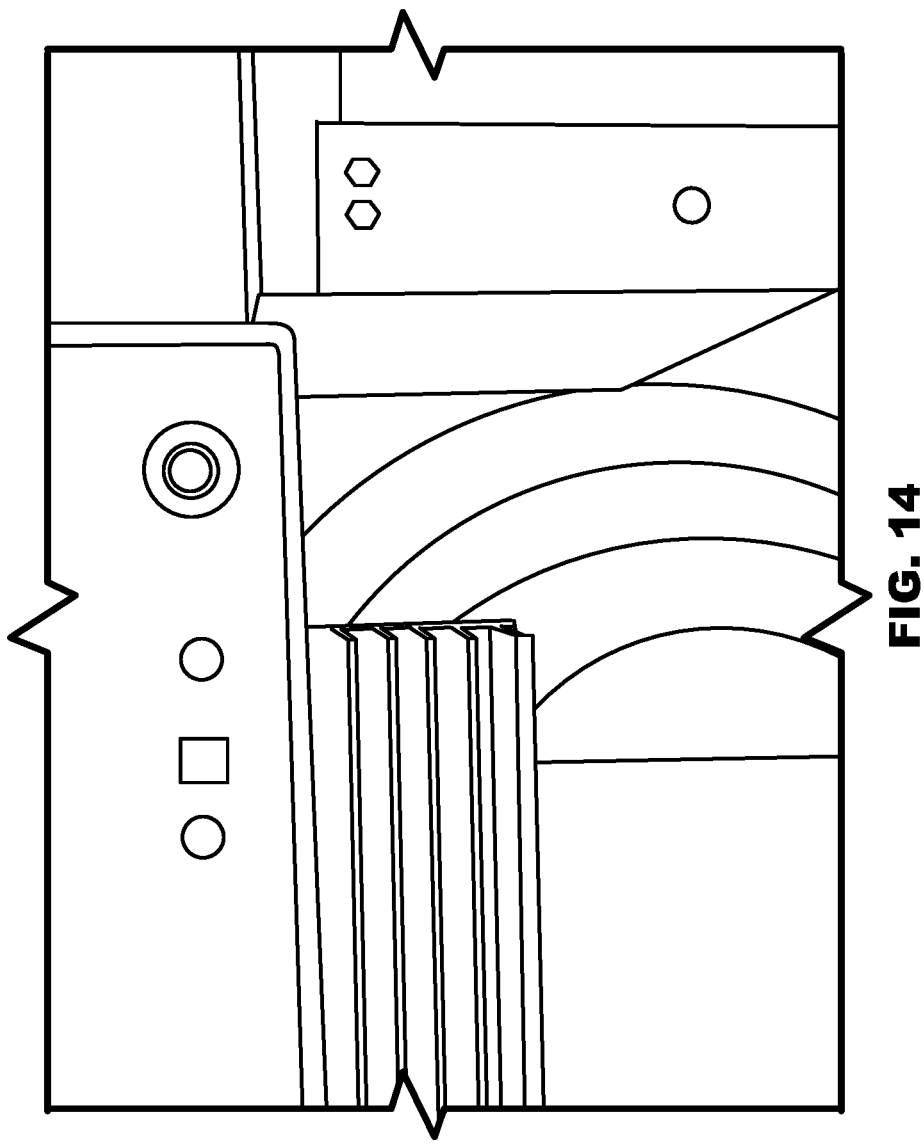
FIG. 14 is a perspective view showing detail of the interior of the portable amplifier of FIG. 9.

Referring now to FIG. 12, amplifier 1100 can comprise a mixing unit 1304 and reverb tank 1306, which are substantially similar to mixing unit 504 and reverb tank 506 (see FIG. 6A). Amplifier 1100 can further comprise power supplies 1308a and 1308b, batteries 1310a and 1310b, and AC power input 1312. Batteries 1310a and 1310b are shown inserted into battery slots (not shown) which are substantially similar to battery ports 508a 508b (see FIG. 6A).

Power supplies 1308a and 1308b can provide positive and negative voltage, for example +36V and −36V or some other voltage in other embodiments.

Mixing unit 1304 can further comprise input port 1314, preamp output port 1316, and extension port 1320. Ports 1314, 1316, 1318 can be configured to receive standard audio plugs including, but not limited to, 3.5 mm, 2.5 mm, or 6.35 mm (¼") plugs for mono (TS) or stereo (TRS) connections. Mixing unit 1304 can further comprise toggle switch 1320. Toggle switch 1320 can be any binary switch known in the art capable of distinguishing between user selected modes for high power and low power. Output amplification ICs 920a and 920b (see FIG. 9) can be electrically connected to toggle switch 1320 such that high power mode activates both amplification ICs 920a and 902b, and low power mode activates only one (for example, amplification IC 920a).

Amplifier 1100 can optionally comprise a handle (not shown), the handle can be substantially similar to handle 104.

Turning now to FIGS. 16-19, amplifier 1100 can be electrically connected, via extension port 1320, to extension cabinet 1600 to create a two-speaker system. FIG. 16 depicts the front view of extension cabinet 1600 according to an embodiment. Extension cabinet 1600 can have external appearance that is substantially similar to amplifier 1100 (see FIG. 10). Extension cabinet 1600 can comprise a single speaker driver 1604, in a cabinet 1606. Cabinet 1606 can form, approximately a 14-inch cube, but can be larger, smaller, or differently shaped or proportioned in other embodiments. Cabinet 1606 can comprise similar materials to cabinet 1106 (see FIG. 10). Cabinet 1606 can also be finished in a manner similar to cabinet 1106 (see FIG. 10). Cabinet 1606 can also comprise slats 1608 which can be substantially similar to slats 1102.

FIG.17 depicts a side of extension cabinet 1600 according to an embodiment. Extension cabinet 1600 can comprise strap 1612, or a handle similar to handle 104 (see FIGS. 2A-2C). Extension cabinet 1600 can further comprise input port 1612 allowing electrical connection to amplifier 1100.

Figure 18:
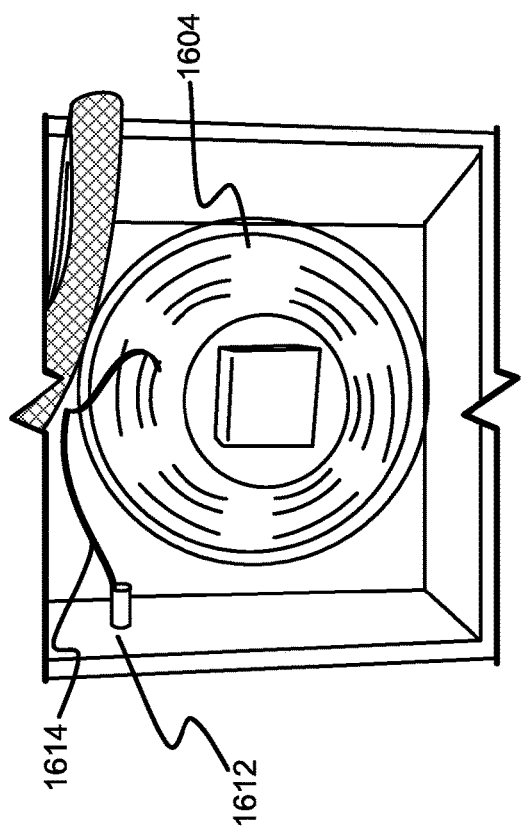
FIG. 18 is a perspective view of the rear side of an extension cabinet according to an embodiment.

FIG. 18 depicts a rear view of extension cabinet 1600. Speaker driver 1604 can be connected to input port 1612 via cable 1614. It can be appreciated that while externally, extension cabinet 1600 can appear similar to amplifier 1100, internally extension cabinet 1600 can contain a minimum of components.

Figure 19:
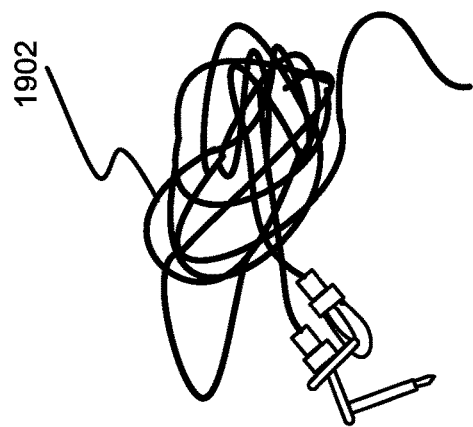
FIG. 19 is a perspective view of an audio cable according to an embodiment.

FIG. 19 depicts audio cable 1902 that can connect amplifier 1100 to extension cabinet 1600. Audio cable 1902 comprises ¼-inch (6.35 mm) male plugs, but can comprise any other connector compatible with extension port 1320 and input port 1612.

Amplifiers 100 and 1100 can comprise components optimized to reduce total weight providing an advantage for portability. In one embodiment, cabinet 102 can weigh about 4 lbs to about 6 lbs. Handles 104a, 104b, latch 106, and hinge 206 can weigh less than about 1 lb in total. Mixing unit 504 can weight about 2.5 lbs. Reverb tank 506 can weigh about 0.75 lb. Speaker drivers 502a, 502b can weigh approximately 4.25 lbs each. Batteries 700 can weigh about 3.25 lbs in total. AC/DC power supplies can weigh about 1.5 lb each. These component weights are only approximate and indicative of an example embodiment. Together, they provide amplifier 100 that weighs about 23 to about 25 lbs, with an estimated sound output of about 112 watts RMS for amplifier 100. This provides a watts per pound characteristic of about 4 to about 5, such as about 4.48 to about 4.87. In other words, in use the portable amplifier can provide a sound output in watts per pound of amplifier weight of about 4 to about 5. This is a significant advantage over conventional amplifiers that can provide less power and weigh more.

In operation, all components of amplifier 100, including loose cords and cables can be stored within cabinet 102. Latch 106 allows amplifier 100 to be securely closed. Amplifier 100 can be lifted by handle 104 for transportation. Amplifier 100 can be transported without batteries installed for a total weight of about 20 to about 22 lbs. Amplifier 100 can be opened by releasing latch 106 and pivoting cabinet portions 204a, 204b away from each other about 45 degrees in each direction at diagonal opening 120 around hinge 206. When amplifier 100 is fully open, speaker openings 210a, 210b lie on adjacent planes that are substantially coplanar, and stabilizing pins 520a, 520b engage with stabilizing holes to prevent overextension or unintentional contraction of hinge 206. This also exposes control panel 304a.

Amplifier 100 can be tilted back in order to allow speaker openings 210a, 210b to be angled up, for example towards a musician. Leg 222 can be extended from hinge cylinder 214 to a length desired by a user, allowing amplifier 100 to tilt-back in a tri-pod format with foot 220, and the rear corners of cabinet portions 204a, 204b in contact with the surface. The adjustable length of leg 222 can allow the angle between amplifier 100 and the surface to be customized as needed.

Power can be provided to the mixing unit 504, 1304 and the lights of control panel 304, 1202 via batteries 700 and/or an AC/DC transformer (not shown). Mixing unit 504, 1304 can therefore provide an output of more than 300 W (or 112 watts RMS), or 116 undistorted decibels. Batteries 700 can be recharged in a conventional charging station externally to amplifiers 100, 1100, in embodiments. One example battery can be recharged in thirty minutes, though this can vary with a given battery in various embodiments.

An instrument, such as a guitar, bass guitar, microphone, keyboard, or any other instrument requiring acoustic amplification can be connected to amplifiers 100, 1100 via input port 404, 1314. Sound input from the instrument can be equalized in mixing unit 504, 1304 based on the settings chosen by the user on control panel 304, 1202. The user can control the relative volume of sound in each of the frequency ranges by adjusting the treble 410, high midrange 412, low midrange 414, and bass 416. The use of two midrange controls allows users to avoid tonal trouble spots that can be encountered with three-band equalizers comprising only one midrange control. Similarly, the user can adjust the appropriate controls to change input volume 420, gain 422 (which can add additional pre-saturation volume), and master (output volume) 424.

The sound signal can be routed to the reverb tank 506, if connected. Reverb tank 506 can provide reverb delay times such as 33 ms, 37 ms and 41 ms for short, medium, and long springs. The amplitude of the reverb signal can be controlled by the user via adjustment of the control for reverb 426. The sound signal can then be routed to a pre-output amplifier and an output amplifier before being output to the speaker drivers to produce the final sound. Sound is output via speaker drivers 502a, 502b, and the shape of cabinet 102 provides an open-back cabinet amplifier, that is less directional and provides a looser bass sound than closed-back amplifiers.

The lights on the control panel 304, 1202 can assist a user in operating the amplifier 100, 1100 in low-light environments. The power switch light can inform the user both where the switch is, and can present a red light to indicate that the amplifier is using AC power or a green light to indicate the that amplifier 100, 1100 is using DC power. Other colors or cues, such as light intensity, can be used in other embodiments. The input port 404 light can indicate where to plug in the instrument. Finally, the lights of the controls 408 can assist the user in seeing where the controls 408 are, and the two row arrangement of the controls 408 within control panel 304, 1202 can make it easier for the user to find the appropriate control, compared to conventional linear control layouts. The illumination of the controls 408 and the ports 404 can allow the user to easily change the configuration of the amplifier 100, 1100.

To close amplifier 100, a user can pull on closure cable 522 in order to disengage stabilizing pins 520a, 520b, and allow rotational movement of cabinet portions 204a 204b. Cabinet portions 204a, 204b can be pivoted around hinge 206 until they meet at diagonal opening 120.

Amplifier 1100 can be operated similarly to amplifier 100, but generally does not comprise a cabinet or housing that can be opened or closed at least in the manner of amplifier 100. Amplifier 1100 can be electrically connected to extension cabinet 1600 via extension port 1320 and input port 1612. When toggle switch 1318 is set to low power, only one speaker driver 1104 is activated. When toggle switch 1318 is set to high power, speaker driver 1604 of extension cabinet 1600 is also activated. Speaker drivers 1104 and 1604 maintain independent electrical connections to mixing unit 1304 such that a fault in either speaker driver or associated amplification IC will not prevent the operation of the other speaker driver.

FIGS. 20-23 depict another embodiment of amplifier 2100. Amplifier 2100 is similar to amplifier 100 but features slats, an alternative tilt-back mechanism, and an alternative latch mechanism. The features of the various embodiments discussed herein, as well as those contemplated by the appended claims, can be mixed-and-matched between and among embodiments in alternate configurations and combinations than those specifically depicted and discussed herein.

Figure 20:
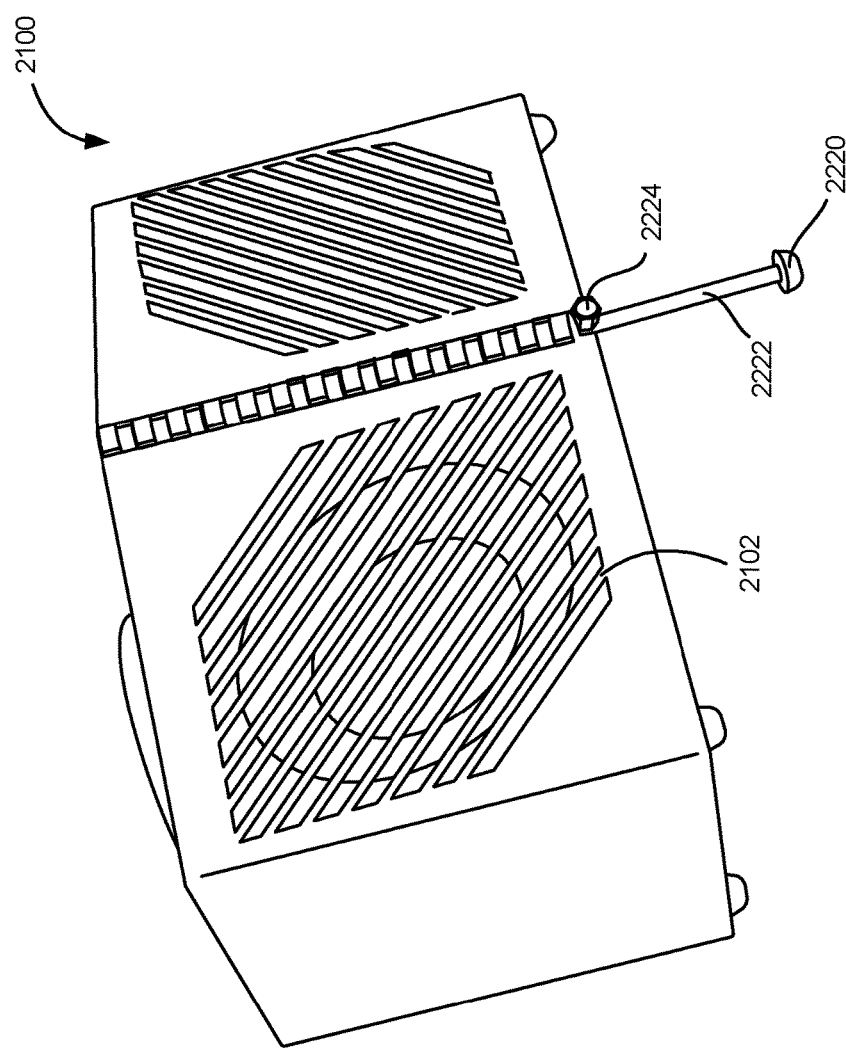
FIG. 20 is a perspective view of the front side of an alternative portable amplifier in a tilt-back configuration according to an embodiment.
Figure 21:
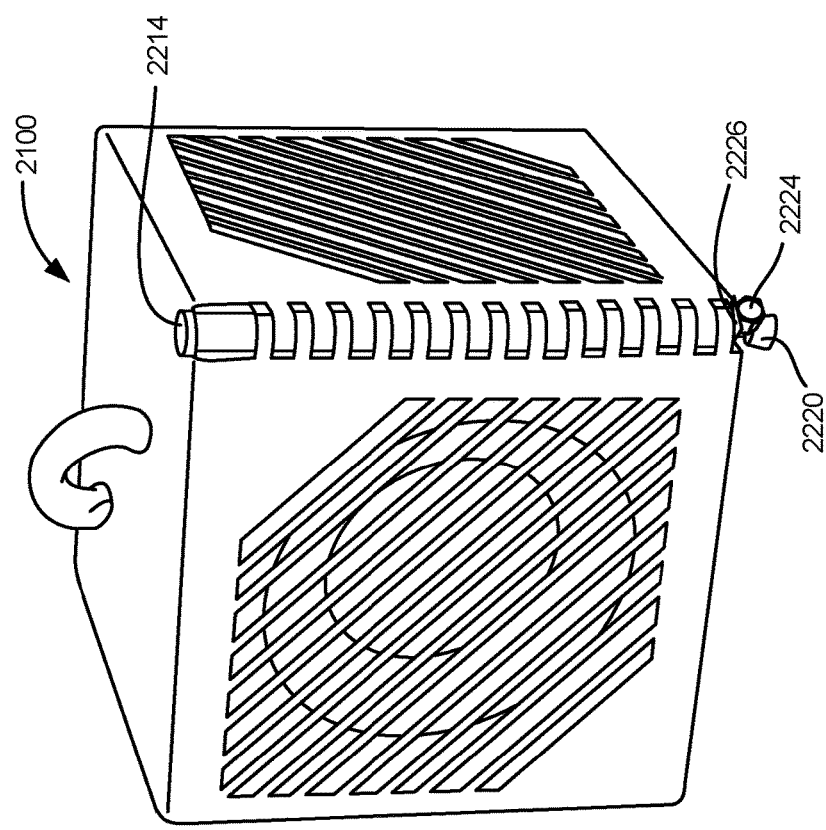
FIG. 21 is a perspective view of the front side of the portable amplifier of FIG. 20.

As can be seen in FIG. 20, slats 2102 can be essentially similar to slats 1102 of amplifier 1100. Slats 2102 and 1102 can eliminate potential dampening from speaker grille cloth or fabric. The tilt-back mechanism of amplifier 2100 can comprise foot 2220, and leg 2222, which can be substantially similar to foot 220 and leg 222 of amplifier 100. Amplifier 2100 further includes set screw 2224 and bracket 2226. Set screw 2224 can enter bracket 2226 in order to frictionally secure leg 2222 in place. In operation, set screw 2224 can be loosened, allowing leg 2222 to move up and down out of hinge cylinder 2214. When leg is extended, as shown in FIG. 20, set screw 2224 can be tightened to hold leg 2222 in tilt-back position. FIG. 21 depicts amplifier 2100 in a non-tilted position, with leg 2222 completely within hinge cylinder 2214.

Figure 22B:
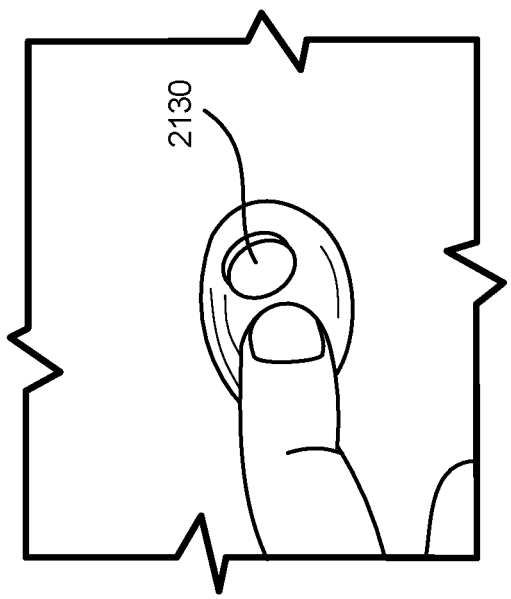
FIG. 22B is a perspective view of the rear side of the portable amplifier of FIG. 20.
Figure 22A:
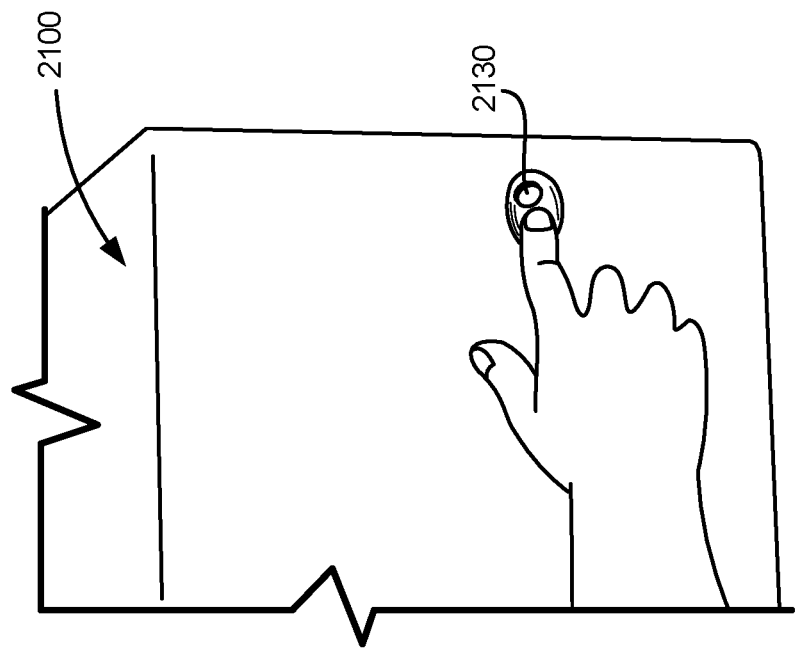
FIG. 22A is a perspective view of the rear side of the portable amplifier of FIG. 20.
Figure 23:
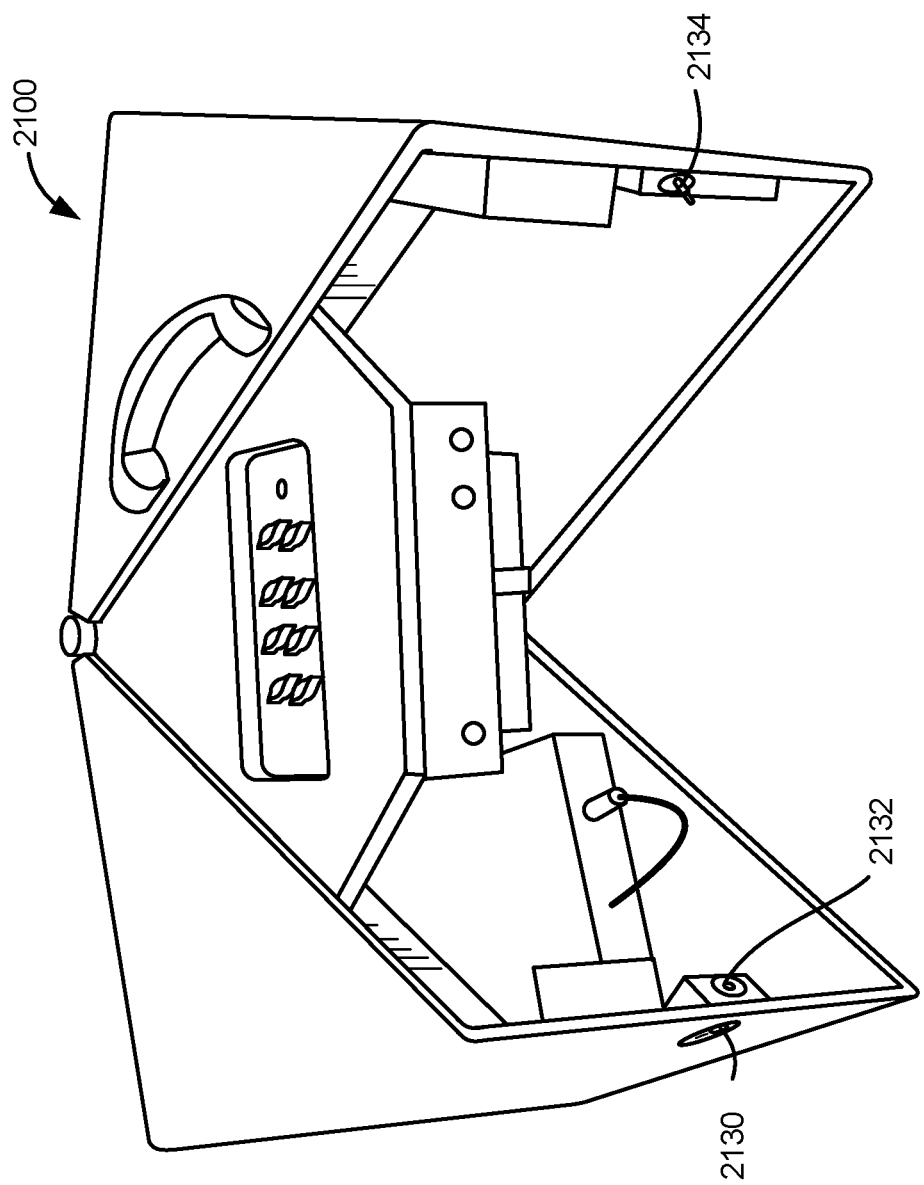
FIG. 23 is a perspective view of the rear side of the portable amplifier of FIG. 20 in an open configuration.

FIGS. 22A, 22B and 23 depict a push button latch mechanism according to an embodiment. In contrast to amplifier 100, amplifier 2100 does not feature a corner facet 108. Amplifier 2100 features button 2130 which can be recessed into the cabinet. As can be seen in FIG. 23, button 2130 can control latch mechanism 2132 which can engage pin 2134. In operation, when button 2130 is not depressed, latch mechanism 2132 can receive pin 2134 when the cabinet of amplifier 2100 is closed. Latch mechanism 2132 can hold pin 2134 until button 2130 is pressed keeping amplifier 2100 closed.

Embodiments of the portable amplifier have a number of advantages over conventional amplifiers. The amplifier has true recording studio sound capable of capturing qualities such as warmth, clarity and volume desired by guitarists and other musicians. In one embodiment, the amplifier has a hinged cabinet design allowing all controls, cords and batteries to be concealed within the cabinet when closed, providing security and convenience for transportation. In addition, when opened, the cabinet doubles in size, which broadens the sound dispersion. The cabinet also has a leg allowing the amplifier to tilt-back, lifting the speaker drivers upwards. In another embodiment, the amplifier can have a main cabinet with a single speaker driver that can optionally be connected to an extension cabinet when a second speaker driver is desired.

When using two speaker drivers is capable of producing continuous average power of about 112 watts RMS, with a total sound output of 116 decibels. The disclosed device can weigh as little as 23 pounds in one embodiment, producing a power to weight ratio of about 4.87 watts per pound. The amplifier can use either AC or DC battery power, and the volume produced can be the same from either AC or batteries. When on battery power, the amplifier is capable of lasting for up to about 4 hours of use in one embodiment. The amplifier has a four-band equalizer (EQ), allowing for split midrange control and user friendly lit controls and inputs, allowing the user to make adjustments and plug in, even in total darkness.

Thus, in an embodiment, a portable amplifier comprises a first speaker unit and a second speaker unit; a mixing unit electrically coupled to the first speaker unit and the second speaker unit; a cabinet having an open orientation and a closed orientation and comprising a first portion and a second portion, the first portion comprising a first speaker opening to receive the first speaker unit and the second portion comprising a second speaker opening to receive the second speaker unit, the first portion and the second portion coupled by a hinge such that the first portion and the second portion each rotate about 45 degrees in opposite directions at the hinge as the cabinet is moved between the open orientation and the closed orientation, wherein the first speaker opening and the second speaker opening are substantially coplanar when the cabinet is in the open orientation and substantially perpendicular when the cabinet is the in closed orientation; a control panel electrically coupled to the mixing unit and arranged in the cabinet such that the control panel is exposed between the first portion and the second portion when the cabinet is in the open orientation and enclosed within the cabinet when the cabinet is in the closed orientation; and a power source electrically coupled with the first speaker unit, the second speaker unit, the mixing unit and the control panel; wherein, in use, the portable amplifier provides a sound output in watts per pound of amplifier weight of about 4 to about 5.

In an embodiment, the portable amplifier provides a sound output in watts per pound of amplifier weight of about 4.48 to about 4.87. The power source can comprise at least one battery arranged in the cabinet. The at least one battery can be rechargeable. The power source can be an external AC power source. The portable amplifier can further comprise a leg coupled to the cabinet proximate the hinge, the leg having a first position in which the leg is substantially within the cabinet and a second position in which the leg is extended from the cabinet such that the cabinet is tilted up by the leg. The portable amplifier can further comprise a cable storage area within the cabinet for storing at least one cable used to couple the amplifier to a sound source when the cabinet is in the closed orientation. The sound source can be at least one of a musical instrument or a microphone. The cabinet can have a cube shape with a flat facet at one edge in the closed orientation. The first portion and the second portion each can have substantially triangular half-cube shapes that meet at the flat facet. The portable amplifier can further comprise a latch arranged on the flat facet of the cabinet to removably second the first portion and the second portion together in the closed orientation. The portable amplifier can further comprise a first handle portion arranged on the first portion and a second handle portion arranged on the second portion, wherein the first handle portion and the second handle portion meet to form a single handle when the cabinet is in the closed orientation. The control panel can comprise at least one light source. The mixing unit can comprise an equalizer that can be adjusted via the control panel. The portable amplifier can further comprise a reverb tank electrically coupled to the control panel, the first speaker unit and the second speaker unit. The portable amplifier can further comprise a stabilizing mechanism configured to stabilize the first portion and the second portion relative to one another when the cabinet is in the open orientation. The cabinet can comprise wood. The portable amplifier can further comprise a shelf arranged in the cabinet and comprising the control panel, wherein the shelf is at least partially exposed when the cabinet is in the open orientation, and wherein the shelf is enclosed within the cabinet when the cabinet is in the closed orientation.

In an embodiment, a method comprises proving a portable amplifier comprising a first speaker unit and a second speaker unit; a mixing unit electrically coupled to the first speaker unit and the second speaker unit; a cabinet having an open orientation and a closed orientation and comprising a first portion and a second portion, the first portion comprising a first speaker opening to receive the first speaker unit and the second portion comprising a second speaker opening to receive the second speaker unit, the first portion and the second portion coupled by a hinge such that the first portion and the second portion each rotate about 45 degrees in opposite directions at the hinge as the cabinet is moved between the open orientation and the closed orientation, wherein the first speaker opening and the second speaker opening are substantially coplanar when the cabinet is in the open orientation and substantially perpendicular when the cabinet is the in closed orientation; and a control panel electrically coupled to the mixing unit and arranged in the cabinet such that the control panel is exposed between the first portion and the second portion when the cabinet is in the open orientation and enclosed within the cabinet when the cabinet is in the closed orientation; and providing a power source for the portable amplifier, electrically coupled with the first speaker unit, the second speaker unit, the mixing unit and the control panel, such that, in use, the portable amplifier provides a sound output in watts per pound of amplifier weight of about 4 to about 5.

It should also be appreciated that the exemplary embodiment or exemplary embodiments are only examples, and are not intended to limit the scope, applicability, or configuration of the invention in any way. Rather, the foregoing detailed description will provide those skilled in the art with an enabling disclosure for implementing the exemplary embodiment or exemplary embodiments. It should be understood that various changes can be made in the function and arrangement of elements without departing from the scope of the invention as set forth in the appended claims and the legal equivalents thereof.

The embodiments above are intended to be illustrative and not limiting. Additional embodiments are within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:
1. A portable amplifier comprising:
a first speaker unit and a second speaker unit;
a mixing unit electrically coupled to the first speaker unit and the second speaker unit;
a cabinet having an open orientation and a closed orientation and comprising a first portion and a second portion, the first portion comprising a first speaker opening to receive the first speaker unit and the second portion comprising a second speaker opening to receive the second speaker unit, the first portion and the second portion coupled by a hinge such that the first portion and the second portion each rotate about 45 degrees in opposite directions at the hinge as the cabinet is moved between the open orientation and the closed orientation, wherein the first speaker opening and the second speaker opening are substantially coplanar with one another when the cabinet is in the open orientation and substantially perpendicular with one another when the cabinet is in the closed orientation;
a control panel electrically coupled to the mixing unit and arranged in the cabinet such that the control panel is exposed between the first portion and the second portion when the cabinet is in the open orientation and enclosed within the cabinet when the cabinet is in the closed orientation; and
a power source electrically coupled with the first speaker unit, the second speaker unit, the mixing unit and the control panel;
wherein, in use, the portable amplifier provides a sound output in watts per pound of amplifier weight of about 4 to about 5.

2. The portable amplifier of claim 1, wherein the portable amplifier provides a sound output in watts per pound of amplifier weight of about 4.48 to about 4.87.

3. The portable amplifier of claim 1, wherein the power source comprises at least one battery arranged in the cabinet.

4. The portable amplifier of claim 3, wherein the at least one battery is rechargeable.

5. The portable amplifier of claim 1, wherein the power source is an external AC power source.

6. The portable amplifier of claim 1, further comprising a leg coupled to the cabinet proximate the hinge, the leg having a first position in which the leg is substantially within the cabinet and a second position in which the leg is extended from the cabinet such that the cabinet is tilted up by the leg.

7. The portable amplifier of claim 1, further comprising a cable storage area within the cabinet for storing at least one cable used to couple the amplifier to a sound source when the cabinet is in the closed orientation.

8. The portable amplifier of claim 7, wherein the sound source is at least one of a musical instrument or a microphone.

9. The portable amplifier of claim 1, wherein the cabinet has a cube shape with a flat facet at one edge in the closed orientation.

10. The portable amplifier of claim 9, wherein the first portion and the second portion each have substantially triangular half-cube shapes that meet at the flat facet.

11. The portable amplifier of claim 10, further comprising a latch arranged on the flat facet of the cabinet to removably secure the first portion and the second portion together in the closed orientation.

12. The portable amplifier of claim 10, further comprising a first handle portion arranged on the first portion and a second handle portion arranged on the second portion, wherein the first handle portion and the second handle portion meet to form a single handle when the cabinet is in the closed orientation.

13. The portable amplifier of claim 1, wherein the control panel comprises at least one light source.

14. The portable amplifier of claim 1, wherein the mixing unit comprises an equalizer that can be adjusted via the control panel.

15. The portable amplifier of claim 1, further comprising a reverb tank electrically coupled to the control panel, the first speaker unit and the second speaker unit.

16. The portable amplifier of claim 1, further comprising a stabilizing mechanism configured to stabilize the first portion and the second portion relative to one another when the cabinet is in the open orientation.

17. The portable amplifier of claim 1, wherein the cabinet comprises wood.

18. The portable amplifier of claim 1, further comprising a shelf arranged in the cabinet and comprising the control panel, wherein the shelf is at least partially exposed when the cabinet is in the open orientation, and wherein the shelf is enclosed within the cabinet when the cabinet is in the closed orientation.

19. The portable amplifier of claim 1, wherein the cabinet has a cube shape in the closed orientation and the first portion and the second portion each have substantially triangular half-cube shapes that meet at an opening edge, further comprising a latch arranged at the opening edge to removably secure the first portion and the second portion together in the closed orientation.

20. A method comprising:
providing a portable amplifier comprising
a first speaker unit and a second speaker unit;
a mixing unit electrically coupled to the first speaker unit and the second speaker unit;
a cabinet having an open orientation and a closed orientation and comprising a first portion and a second portion, the first portion comprising a first speaker opening to receive the first speaker unit and the second portion comprising a second speaker opening to receive the second speaker unit, the first portion and the second portion coupled by a hinge such that the first portion and the second portion each rotate about 45 degrees in opposite directions at the hinge as the cabinet is moved between the open orientation and the closed orientation, wherein the first speaker opening and the second speaker opening are substantially coplanar with one another when the cabinet is in the open orientation and substantially perpendicular with one another when the cabinet is in the closed orientation; and
a control panel electrically coupled to the mixing unit and arranged in the cabinet such that the control panel is exposed between the first portion and the second portion when the cabinet is in the open orientation and enclosed within the cabinet when the cabinet is in the closed orientation; and
providing a power source for the portable amplifier, electrically coupled with the first speaker unit, the second speaker unit, the mixing unit and the control panel, such that, in use, the portable amplifier provides a sound output in watts per pound of amplifier weight of about 4 to about 5.

* * * * *